United States Patent
Choi et al.

(10) Patent No.: US 12,166,059 B2
(45) Date of Patent: Dec. 10, 2024

(54) IMAGE SENSOR

(71) Applicant: Samsung Electronics Co., Ltd., Suwon-si (KR)

(72) Inventors: Min-Jun Choi, Hwaseong-si (KR); Won Oh Ryu, Hwaseong-si (KR); Hyeon Woo Lee, Hwaseong-si (KR); Gyu Hyun Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 413 days.

(21) Appl. No.: 17/725,750

(22) Filed: Apr. 21, 2022

(65) Prior Publication Data
US 2023/0039809 A1 Feb. 9, 2023

(30) Foreign Application Priority Data
Aug. 5, 2021 (KR) ........................ 10-2021-0102976

(51) Int. Cl.
*H01L 27/146* (2006.01)
*H01L 23/00* (2006.01)
*H01L 23/48* (2006.01)

(52) U.S. Cl.
CPC ...... *H01L 27/14634* (2013.01); *H01L 23/481* (2013.01); *H01L 24/08* (2013.01); *H01L 27/14636* (2013.01); *H01L 27/14641* (2013.01); *H01L 27/14621* (2013.01); *H01L 27/14627* (2013.01); *H01L 2224/08145* (2013.01)

(58) Field of Classification Search
None
See application file for complete search history.

(56) References Cited

U.S. PATENT DOCUMENTS

| | | |
|---|---|---|
| 5,998,864 A | 12/1999 | Khandros et al. |
| 7,682,962 B2 | 3/2010 | Hembree |
| 7,829,998 B2 | 11/2010 | Do et al. |
| 7,852,675 B2 | 12/2010 | Maejima |
| 7,919,846 B2 | 4/2011 | Hembree |
| 8,018,058 B2 | 9/2011 | Lee |
| 8,247,268 B2 | 8/2012 | Do et al. |
| 8,436,477 B2 | 5/2013 | Crisp et al. |
| 9,496,309 B2 | 11/2016 | Yang |
| 9,530,811 B2 | 12/2016 | Wan et al. |

(Continued)

*Primary Examiner* — Asok K Sarkar
(74) *Attorney, Agent, or Firm* — Harness, Dickey & Pierce, P.L.C.

(57) ABSTRACT

An image sensor comprises a first and second chips. The first chip includes a first semiconductor substrate, a photoelectric conversion layer in the first semiconductor substrate, a color filter, a micro lens, a first transistor adjacent to the photoelectric conversion layer, a first insulating layer, and a first metal layer in the first insulating layer and connected to the first transistor. The second chip includes a second insulating layer, a second semiconductor substrate, a second transistor on the second semiconductor substrate, a second metal layer in the second insulating layer and connected to a gate structure of the second transistor through a gate contact, a landing metal layer below the second metal layer, and a through via in direct contact with the landing metal layer and vertically passing through the second semiconductor substrate. A width of the through via becomes narrower as the width approaches the third surface.

20 Claims, 30 Drawing Sheets

(56) References Cited

U.S. PATENT DOCUMENTS

| | | |
|---|---|---|
| 9,780,136 B2 | 10/2017 | Kwon |
| 9,978,796 B2 | 5/2018 | Liu et al. |
| 10,497,731 B2 | 12/2019 | Kazue et al. |
| 10,580,819 B2 | 3/2020 | Takahashi |
| 10,741,607 B2 | 8/2020 | Yoon et al. |
| 10,998,366 B2 | 5/2021 | Yoon et al. |
| 2017/0309667 A1* | 10/2017 | Yamashita ........ H01L 27/14643 |
| 2019/0115387 A1 | 4/2019 | Yamagishi et al. |
| 2020/0035736 A1* | 1/2020 | Nagahama .............. H01L 24/03 |
| 2020/0105813 A1* | 4/2020 | Hashiguchi ......... H01L 21/3205 |

* cited by examiner

IMAGE SENSOR

CROSS-REFERENCE TO RELATED APPLICATION

This application claims priority from Korean Patent Application No. 10-2021-0102976 filed on Aug. 5, 2021 in the Korean Intellectual Property Office, the disclosure of which is incorporated herein by reference in its entirety.

BACKGROUND

1. Field

The present inventive concepts relate to image sensors.

2. Description of the Related Art

An image sensing device is one of the semiconductor devices that convert optical information into an electrical signal. The image sensing device may include a charge coupled device (CCD) image sensing device and a complementary metal-oxide semiconductor (CMOS) image sensing device.

The CMOS image sensor may be abbreviated as a CIS (CMOS image sensor). The CIS may include a plurality of two-dimensionally arranged pixels. Each of the pixels may include, for example, a photodiode (PD). The photodiode may serve to convert incident light into an electrical signal.

Recently, with development of computer and communications industries, demands for miniaturized image sensing devices with improved performance have increased in various fields, such as digital cameras, video cameras, smartphones, game consoles, security cameras, medical micro cameras, and robots. Accordingly, research on highly-scaled, highly-integrated semiconductor devices in the image sensing device is being conducted, and patterns of the semiconductor devices may have a fine width and may be separated from each other by a fine pitch.

SUMMARY

Aspects of the present inventive concepts provide an image sensor including lines with a reduced width and pitch by including a scaled through-silicon via (TSV).

Aspects of the present inventive concepts also provide an image sensor in which a design rule for forming lines is reduced by including a scaled TSV.

It should be noted that objects of the present inventive concepts are not limited to the above-described objects, and other objects of the present inventive concepts will be apparent to those skilled in the art from the following descriptions.

An image sensor according to some example embodiments of the present inventive concepts may include a sequential stack of a first chip and a second chip. The first chip may include a first semiconductor substrate including a first surface and a second surface opposite to the first surface, a photoelectric conversion layer in the first semiconductor substrate, a color filter on the first surface, a micro lens covering the color filter, a first transistor on the second surface of the first semiconductor substrate and adjacent to the photoelectric conversion layer, a first insulating layer on the second surface, and a first metal layer in the first insulating layer and connected to the first transistor. The second chip may include a second insulating layer including a third surface in direct contact with the first insulating layer and a fourth surface opposite to the third surface, a second semiconductor substrate on the fourth surface of the second insulating layer, a second transistor on the second semiconductor substrate, a second metal layer in the second insulating layer and connected to a gate structure of the second transistor through a gate contact, a landing metal layer below the second metal layer with respect to the second semiconductor substrate, and a through via in direct contact with the landing metal layer and vertically passing through the second semiconductor substrate. A width of the through via may become narrower as the width of the through via approaches the third surface.

An image sensor according to some example embodiments of the present inventive concepts may include a sequential stack of a first chip, a second chip, and a third chip, and a pad metal connecting the second chip and the third chip. The first chip may include a first semiconductor substrate including a first surface and a second surface opposite to the first surface, a photoelectric conversion layer in the first semiconductor substrate, a color filter on the first surface, a micro lens covering the color filter, a first transistor on the second surface of the first semiconductor substrate and adjacent to the photoelectric conversion layer, a first insulating layer on the second surface, and a first metal layer in the first insulating layer and connected to the first transistor. The second chip may include a second insulating layer including a third surface in direct contact with the first insulating layer and a fourth surface opposite to the third surface, a second semiconductor substrate on the fourth surface of the second insulating layer, a second transistor on the second semiconductor substrate, a second metal layer in the second insulating layer and connected to a gate structure of the second transistor through a gate contact, a landing metal layer below the second metal layer with respect to the second semiconductor substrate, and a through via in direct contact with the landing metal layer and vertically passing through the second semiconductor substrate. The third chip may include a third insulating layer including a fifth surface on which the pad in direct contact with the through via is disposed and a sixth surface opposite to the fifth surface, a third semiconductor substrate on the sixth surface of the third insulating layer, a third transistor on the third semiconductor substrate, and a third metal layer in the third insulating layer and connected to the third transistor. A width of the through via may become narrower as the width of the through via approaches the third surface.

An image sensor according to some example embodiments of the present inventive concepts may include a sequential stack of a first chip, a second chip, and a third chip, and a pad metal connecting the second chip and the third chip. The first chip may include a first semiconductor substrate including a first surface and a second surface opposite to the first surface, a photoelectric conversion layer in the first semiconductor substrate, a color filter on the first surface; a micro lens covering the color filter, a first transistor on the second surface of the first semiconductor substrate and adjacent to the photoelectric conversion layer, a first insulating layer on the second surface, a first metal layer in the first insulating layer and connected to the first transistor, and a first bonding pad electrically connected to the first metal layer, the first bonding pad being in the first insulating layer, the first bonding pad having one surface exposed on the first insulating layer. The second chip may include a second insulating layer including a third surface in direct contact with the first insulating layer and a fourth surface opposite to the third surface, a second semiconductor substrate on the fourth surface of the second insulating layer, a second transistor on the second semiconductor substrate, a second metal layer in the second insulating layer and connected to a gate structure of the second transistor through a gate contact, a second bonding pad connected to the second metal layer, the second bonding pad being in the second insulating layer, the second bonding pad having one surface exposed on the third surface of the second insulating layer, a landing metal layer below the second metal layer with respect to the second semiconductor substrate, and a through via in direct contact with the landing metal layer and vertically passing through the second semiconductor substrate. The third chip may include a third insulating layer including a fifth surface on which the pad in direct contact with the through via is disposed and a sixth surface opposite to the fifth surface, a third semiconductor substrate on the sixth surface of the third insulating layer, a third transistor on the third semiconductor substrate, and a third metal layer in the third insulating layer and connected to the third transistor. A width of the through via may become narrower as the width of the through via approaches the third surface, and the first bonding pad may be in direct contact with the second bonding pad.

BRIEF DESCRIPTION OF THE DRAWINGS

The above and other aspects and features of the present inventive concepts will become more apparent by describing some example embodiments thereof in detail with reference to the attached drawings, in which.

DETAILED DESCRIPTION

Figure 1:
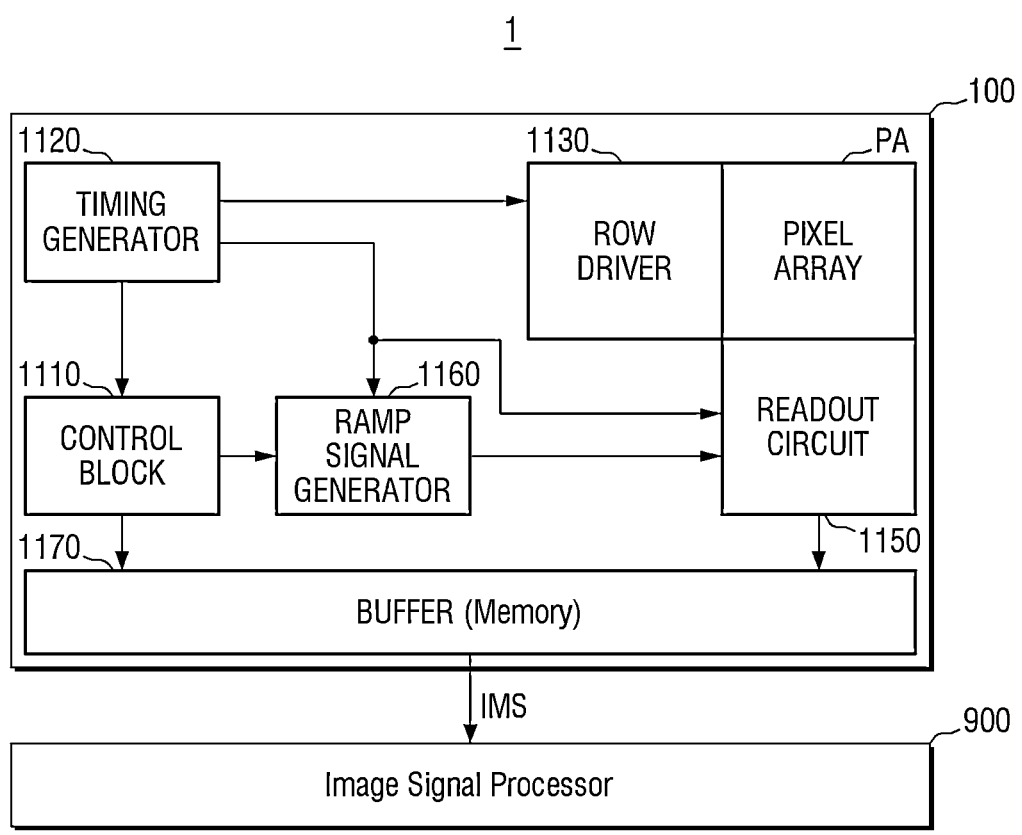
FIG. 1 is a block diagram of an image sensing device according to some example embodiments of the present inventive concepts.

Hereinafter, example embodiments according to the technical spirit of the present inventive concepts will be described with reference to the accompanying drawings. In describing FIGS. 1 to 27, the same reference numerals are used for substantially the same components, and duplicate descriptions of the components will be omitted. Further, like reference numerals are used for like elements throughout various drawings of the present inventive concepts.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a block diagram of an image sensing device according to some example embodiments of the present inventive concepts. Referring to FIG. 1, an image sensing device 1 may include an image sensor 100 and an image signal processor 900.

The image sensor 100 may generate an image signal IMS by sensing an image of an object to be sensed using light. In some example embodiments, the generated image signal IMS may be, for example, a digital signal, but the example embodiments according to the technical spirit of the present inventive concepts are not limited thereto.

The image signal IMS may be provided to the image signal processor 900 and processed. The image signal processor 900 may receive the image signal IMS output from a buffer 1170 of the image sensor 100 and process the received image signal IMS to be easily displayed.

In some example embodiments, the image signal processor 900 may perform digital binning on the image signal IMS output from the image sensor 100. In this case, the image signal IMS output from the image sensor 100 may be a raw image signal, on which analog binning is not performed, from a pixel array PA or the image signal IMS on which the analog binning is already performed.

In some example embodiments, the image sensor 100 and the image signal processor 900 may be separated from each other and disposed as shown in the drawing. For example, the image sensor 100 may be mounted on a first chip, and the image signal processor 900 may be mounted on a second chip. The image sensor 100 and the image signal processor 900 may communicate with each other through a predetermined interface. However, the example embodiments are not limited thereto, and the image sensor 100 and the image signal processor 900 may be implemented as one package, for example, a multi-chip package (MCP).

The image sensor 100 may include a control register block 1110, a timing generator 1120, a row driver 1130, the pixel array PA, a readout circuit 1150, a ramp signal generator 1160, and the buffer 1170.

The control register block 1110 may control overall operations of the image sensor 100. In particular, the control register block 1110 may transmit operation signals directly to the timing generator 1120, the ramp signal generator 1160, and the buffer 1170.

The timing generator 1120 may generate a signal that is a reference for operation timings of various components of the image sensor 100. The operation timing reference signal generated by the timing generator 1120 may be transmitted to the row driver 1130, the readout circuit 1150, and the ramp signal generator 1160.

The ramp signal generator 1160 may generate and transmit a ramp signal used in the readout circuit 1150. For example, the readout circuit 1150 may include a correlated double sampler (CDS), a comparator, and the like, and the ramp signal generator 1160 may generate and transmit the ramp signal used in the CDS, the comparator, or the like.

The buffer 1170 may include, for example, a latch portion. The buffer 1170 may temporarily store the image signal IMS to be transmitted to the outside, and may transmit the image signal IMS to an external memory or an external device. The buffer 1170 may include a memory element, for example, memory cells or the like such as a dynamic random access memory (DRAM) element, a static random access memory (SRAM) element, a spin-transfer torque magnetic random-access memory (STT-MRAM) element, and a flash memory element. However, the example embodiments according to the technical spirit of the present inventive concepts are not limited thereto.

The pixel array PA may sense an external image. The pixel array PA may include a plurality of pixels (or unit pixels). The row driver 1130 may selectively activate a row of the pixel array PA.

The readout circuit 1150 may sample a pixel signal provided from the pixel array PA, compare the sampled pixel signal with the ramp signal, and convert an analog image signal (data) into a digital image signal (data) on the basis of the comparison result.

Figure 2:
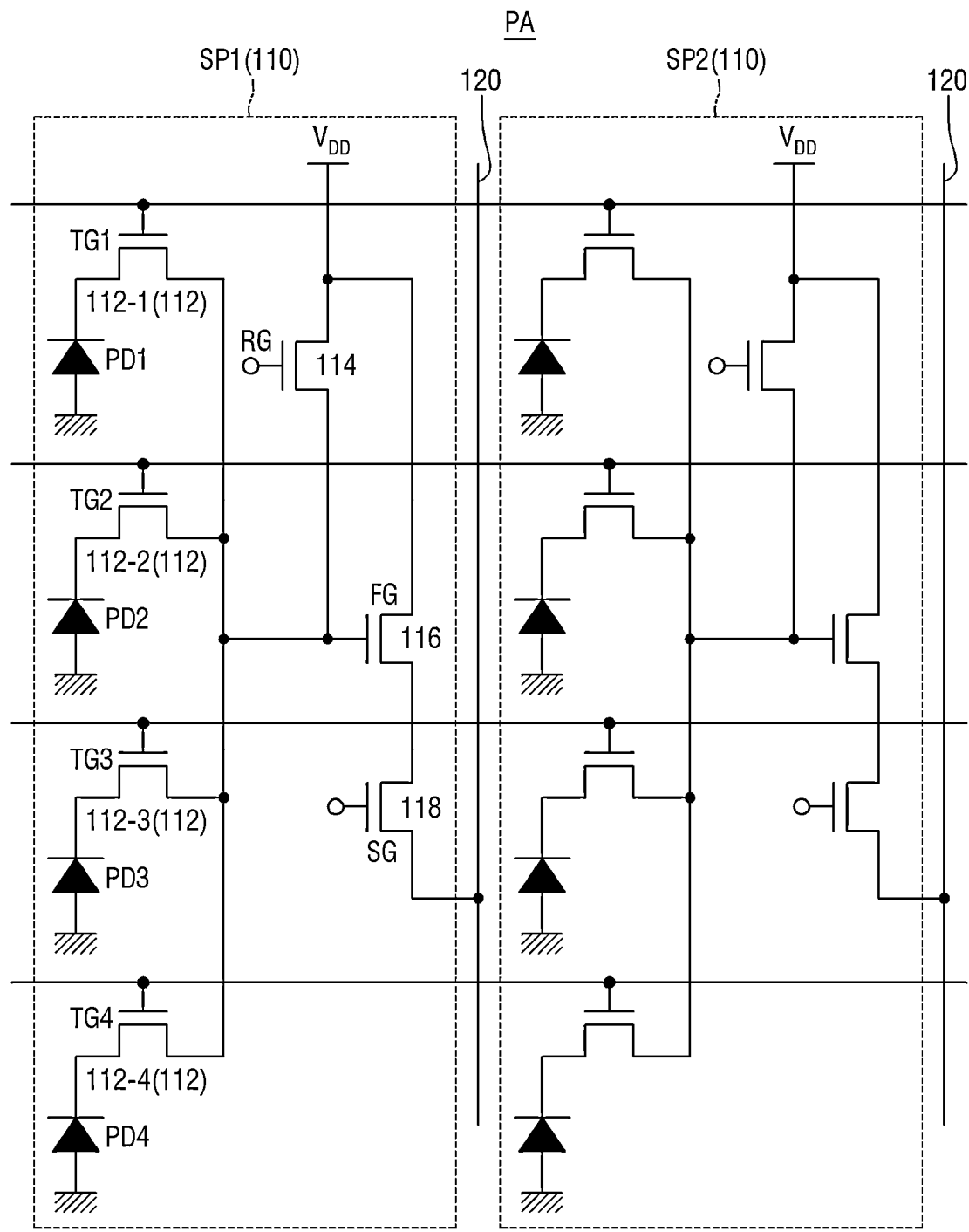
FIGS. 2 and 3 are a circuit diagram of a unit pixel of a pixel array and a schematic plan view corresponding thereto, respectively.
Figure 3:
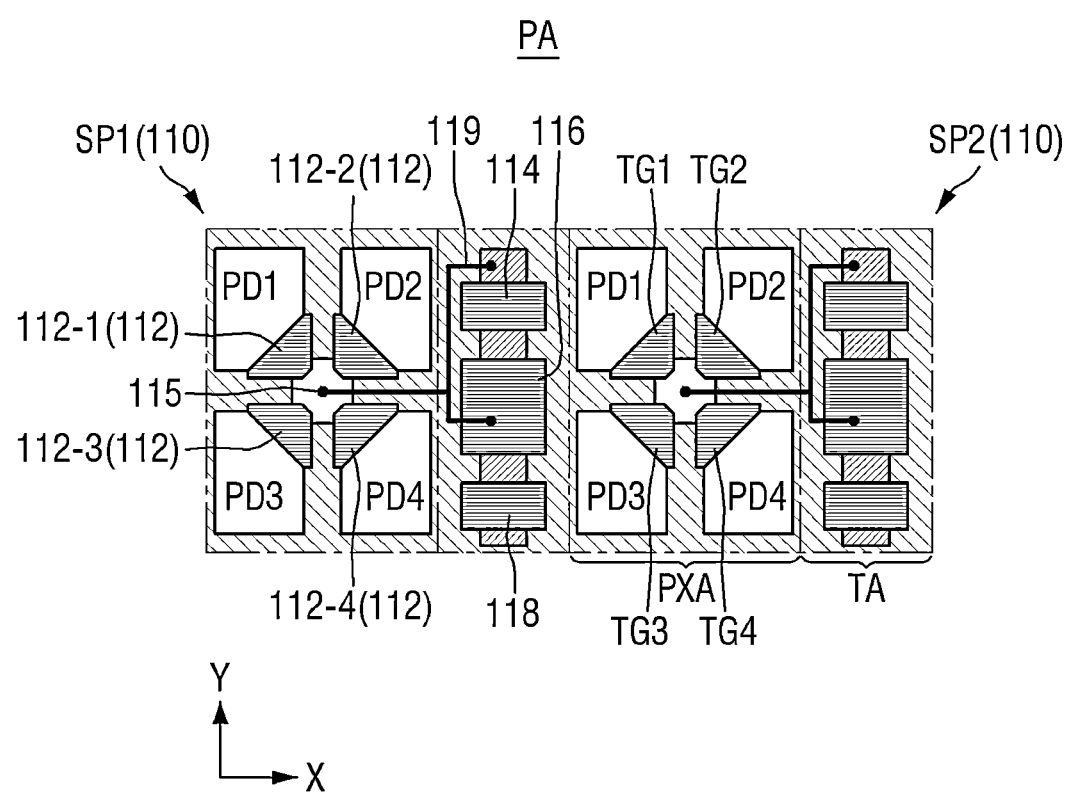

FIGS. 2 and 3 are a circuit diagram of a unit pixel of the pixel array and a schematic plan view corresponding thereto, respectively.

Referring to FIGS. 2 and 3, in the image sensor 100 of some example embodiments, 4-shared pixels 110 may be arranged in a two-dimensional array structure in the pixel array PA. Only two 4-shared pixels SP1 and SP2 adjacent to each other in a first direction X are illustrated in FIG. 3, but in the pixel array PA, a plurality of 4-shared pixels 110 may be arranged in a two-dimensional array structure in the first direction X and a second direction Y intersecting the first direction X.

Specifically, in the image sensor 100 of some example embodiments, four pixels are arranged in a pixel region PXA, and transistors 114, 116, and 118 excluding transmission transistors 112 may be disposed in a transistor region TA. Four pixels may constitute one 4-shared pixel. For example, a first 4-shared pixel SP1 may have a structure in which four photodiodes PD1 to PD4 surround and share one floating diffusion (FD) region 115. In addition, a second 4-shared pixel SP2 may also have a structure in which four photodiodes PD1 to PD4 share one FD region 115. In the image sensor 100 of some example embodiments, one photodiode may constitute one pixel.

In the 4-shared pixel 110, sharing of one FD region 115 by the four photodiodes PD1 to PD4 may be implemented through the transmission transistors 112 respectively corresponding to the photodiodes PD1 to PD4. Specifically, a first transmission transistor 112-1 corresponding to a first photodiode PD1, a second transmission transistor 112-2 corresponding to a second photodiode PD2, a third transmission transistor 112-3 corresponding to a third photodiode PD3, and a fourth transfer transistor 112-4 corresponding to a fourth photodiode PD4 may share the FD region 115 as a common drain region.

Meanwhile, in the 4-shared pixel 110, the four photodiodes PD1 to PD4 may share the transistors 114, 116, and 118 excluding the transmission transistors 112. The four photodiodes PD1 to PD4 constituting the 4-shared pixel 110 may share a reset transistor 114, a source follower transistor 116, and a selection transistor 118. The reset transistor 114, the source follower transistor 116, and the selection transistor 118 may be arranged along the second direction Y in the transistor region TA, but the technical spirit of the present inventive concepts is not limited thereto.

Referring to FIG. 2, the four photodiodes PD1 to PD4 may be respectively connected to source regions of the four transmission transistors 112 corresponding thereto. A drain region of each of the transmission transistors 112 may be connected to a source region of the reset transistor 114. The common drain region of the transmission transistors 112 may correspond to the FD region 115. The FD region 115 may be connected to a gate electrode of the source follower transistor 116, that is, a source follower gate electrode FG, and the source region of the reset transistor 114 through a line 119. A common point of a drain region of the reset transistor 114 and a drain region of the source follower transistor 116 may be connected to a power supply voltage VDD. A source region of the source follower transistor 116 and a drain region of the selection transistor 118 may be shared with each other, and a column signal line 120 may be connected to a source region of the selection transistor 118. A voltage of the source region of the selection transistor 118 may be output to the column signal line 120 as an output signal.

In the image sensor 100 of some example embodiments, the unit pixel constituting the pixels 110 of the pixel array PA may include four shared pixels and the transistors 114, 116, and 118 of the transistor region TA corresponding thereto. In addition, the unit pixel may include transmission transistors 112 corresponding to the number of shared photodiodes.

However, the structure of the unit pixel of the pixel array PA is not limited to the 4-shared pixel structure. For example, the unit pixel of the pixel array PA may have a 2-shared pixel structure including two pixels and a pixel transistor corresponding thereto, an 8-shared pixel structure including eight pixels and a pixel transistor corresponding thereto, or the like.

Figure 4:
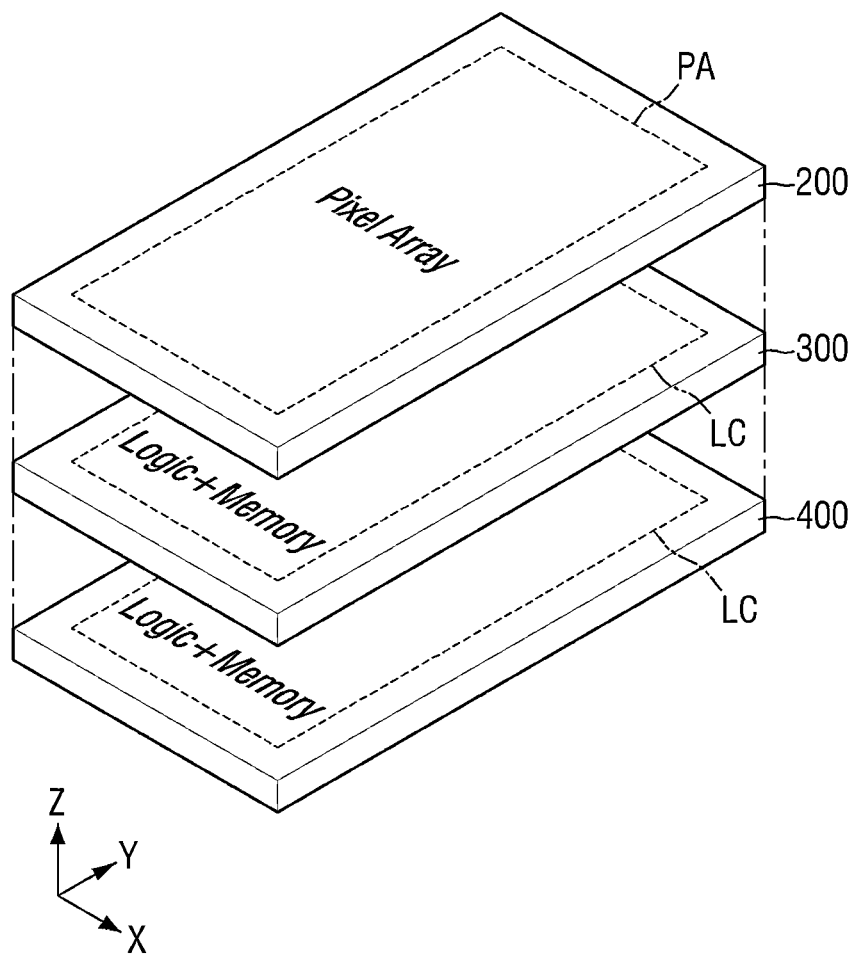
FIG. 4 is a view illustrating a conceptual layout of an image sensor according to some example embodiments of the present inventive concepts.

FIG. 4 is a view illustrating a conceptual layout of an image sensor according to some example embodiments of the present inventive concepts.

An image sensor 100a may include an upper chip 200, an intermediate chip 300, and a lower chip 400. The lower chip 400, the intermediate chip 300, and the upper chip 200 may be sequentially stacked in a third direction Z. Restated, the image sensor 100a may include a sequential stack of the lower chip 400, the intermediate chip 300, and the upper chip 200. The upper chip 200 may have a plurality of pixels arranged in a two-dimensional array structure. That is, the upper chip 200 may include a pixel array PA. Each of the intermediate chip 300 and the lower chip 400 may include a logic region LC and a memory region. The intermediate chip 300 may allow pixel signals transmitted from the upper chip 200 to be transmitted to the logic region LC of each of the intermediate chip 300 and the lower chip 400.

Logic elements may be disposed in the logic region LC of each of the intermediate chip 300 and the lower chip 400. The logic elements may include circuits for processing pixel signals from the pixels. For example, the logic elements may include the control register block 1110, the timing generator 1120, the row driver 1130, the readout circuit 1150, the ramp signal generator 1160, and the like of FIG. 1.

Memory cells such as a DRAM element, an SRAM element, an STT-MRAM element, and a flash memory element may be disposed in the memory region of each of the intermediate chip 300 and the lower chip 400. For example, a plurality of memory cells may be arranged in a two-dimensional array structure or arranged three-dimensionally in the memory region, and may be formed in an embedded form.

The memory region may be used as an image buffer memory for storing a frame image. Accordingly, the image sensor 100a may temporarily store a frame image using a memory and perform signal processing to minimize a Zello effect, thereby improving the operating characteristics of the image sensor 100a. Further, the memory of the image sensor 100a is formed with logic elements in an embedded form, thereby simplifying a manufacturing process and reducing a size of a product.

Figure 5:
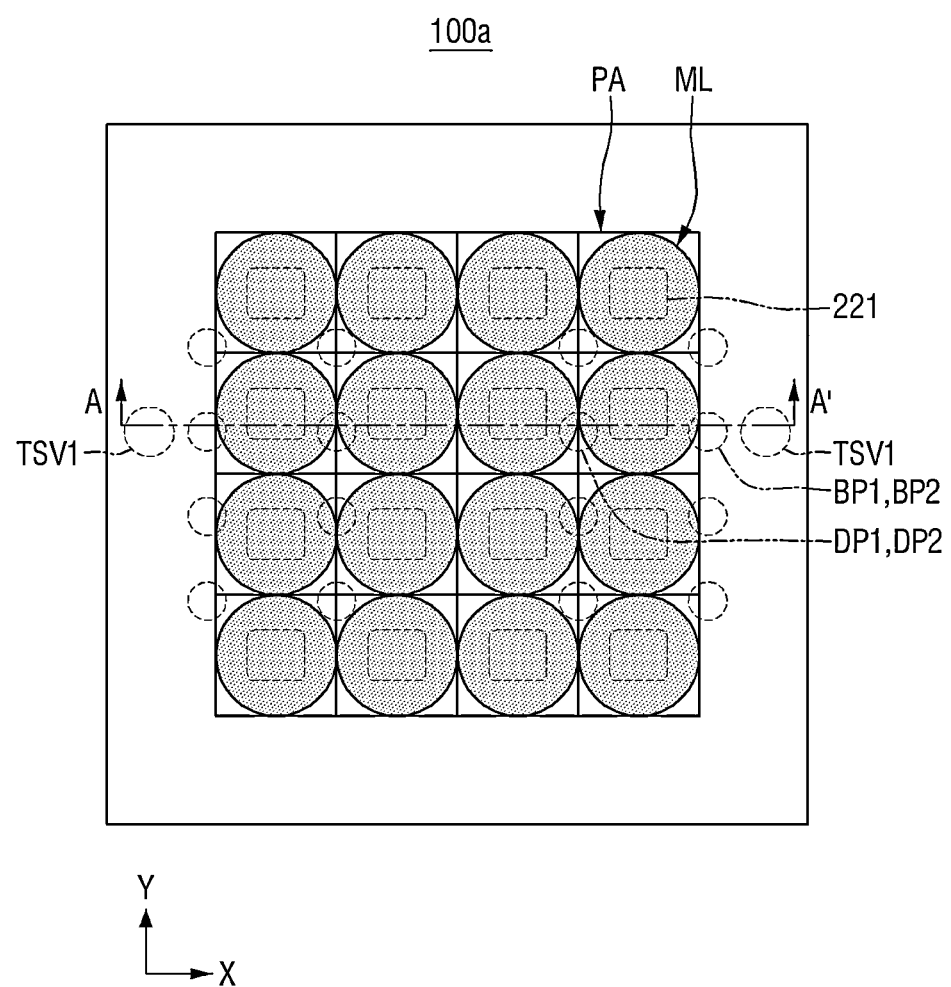
FIG. 5 is a top view of the image sensor of FIG. 4.
Figure 6:
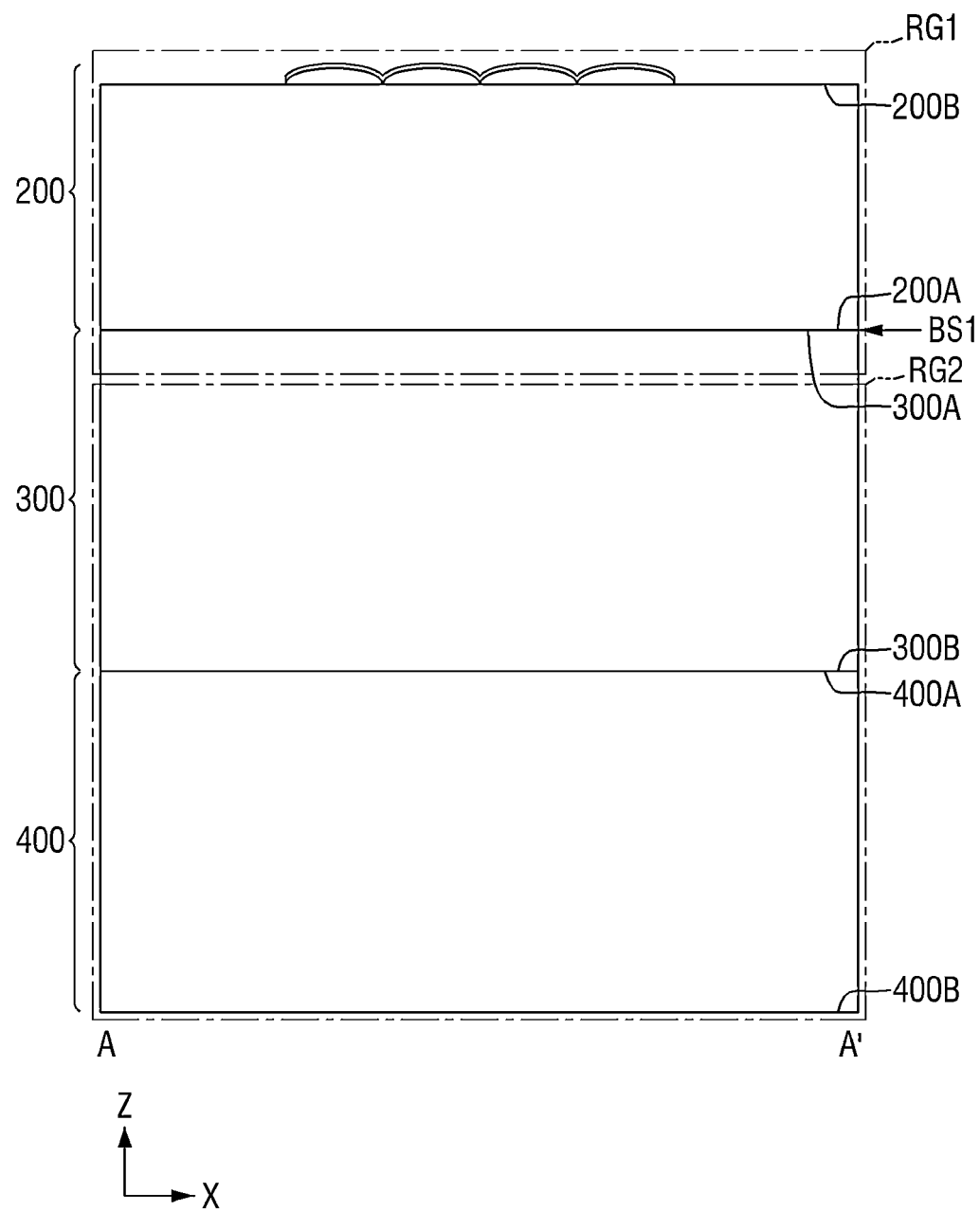
FIG. 6 is a cross-sectional view of the image sensor taken along line A-A' of FIG. 5.
Figure 7:
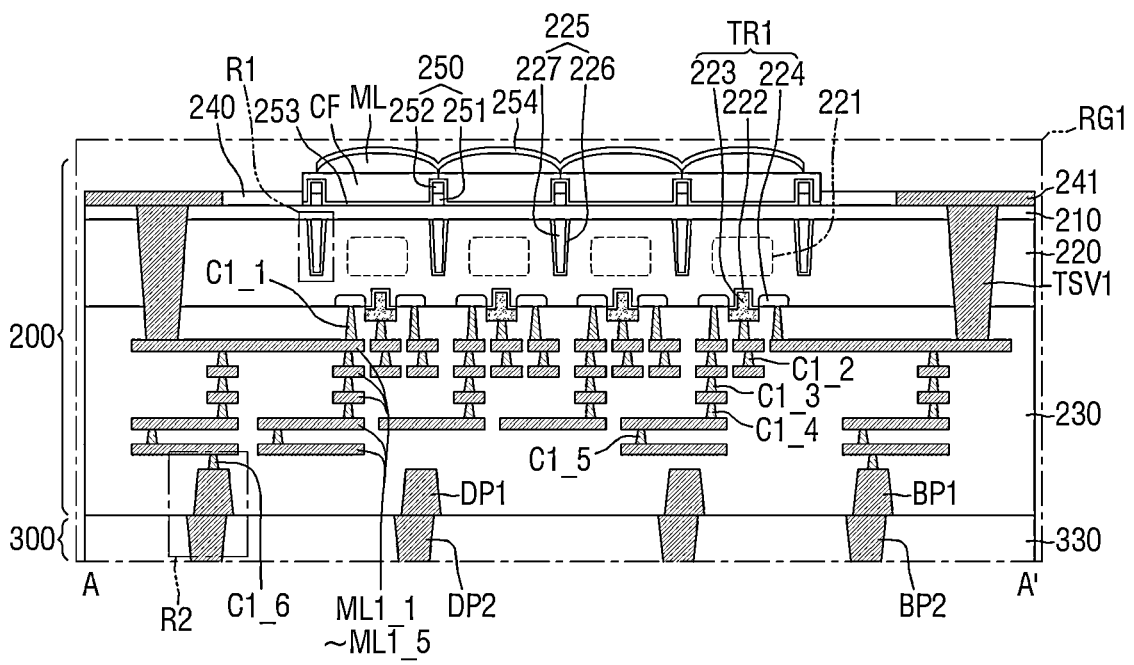
FIG. 7 is an enlarged view of region RG1 of FIG. 6.
Figure 8:
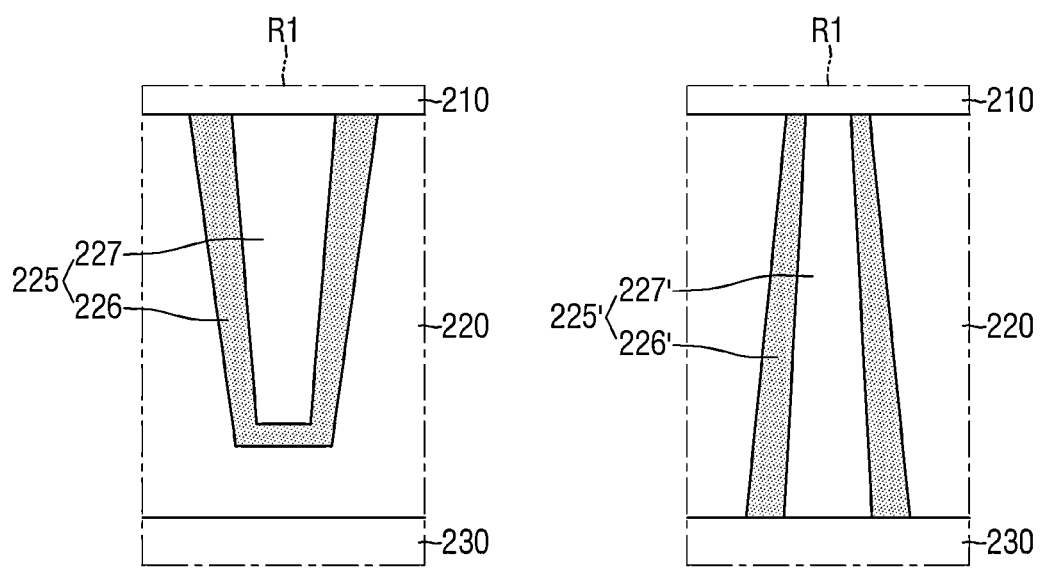
FIG. 8 is an enlarged view of region R1 of FIG. 7.
Figure 9:
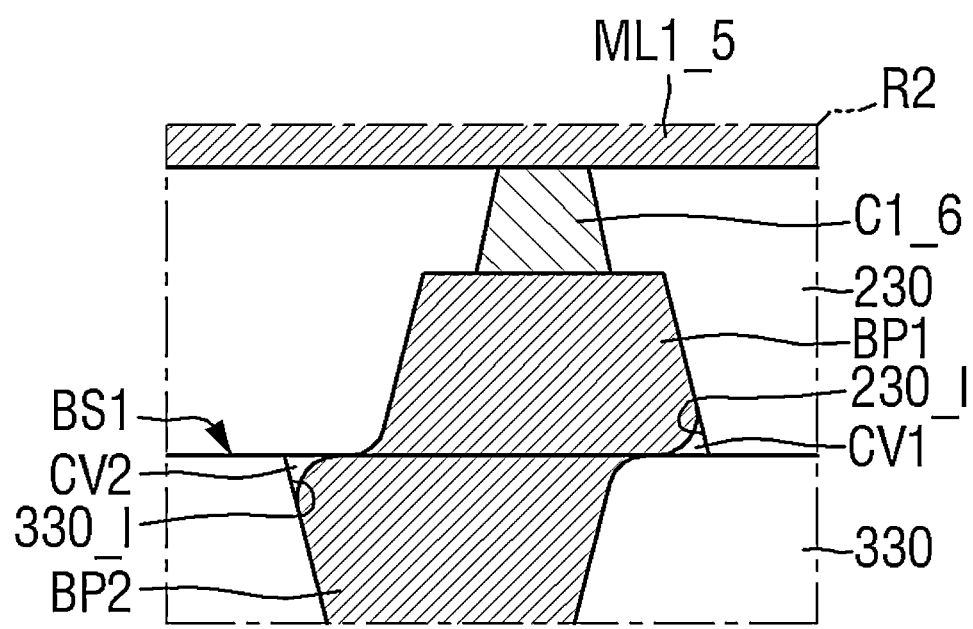
FIGS. 9 and 10 are enlarged views of region R2 of FIG. 7.
Figure 10:
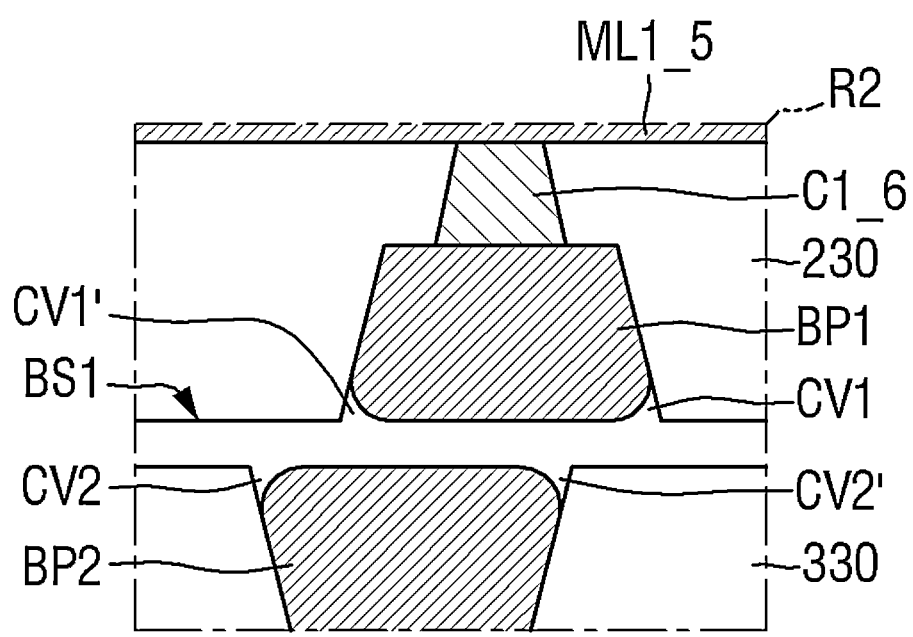
Figure 11:
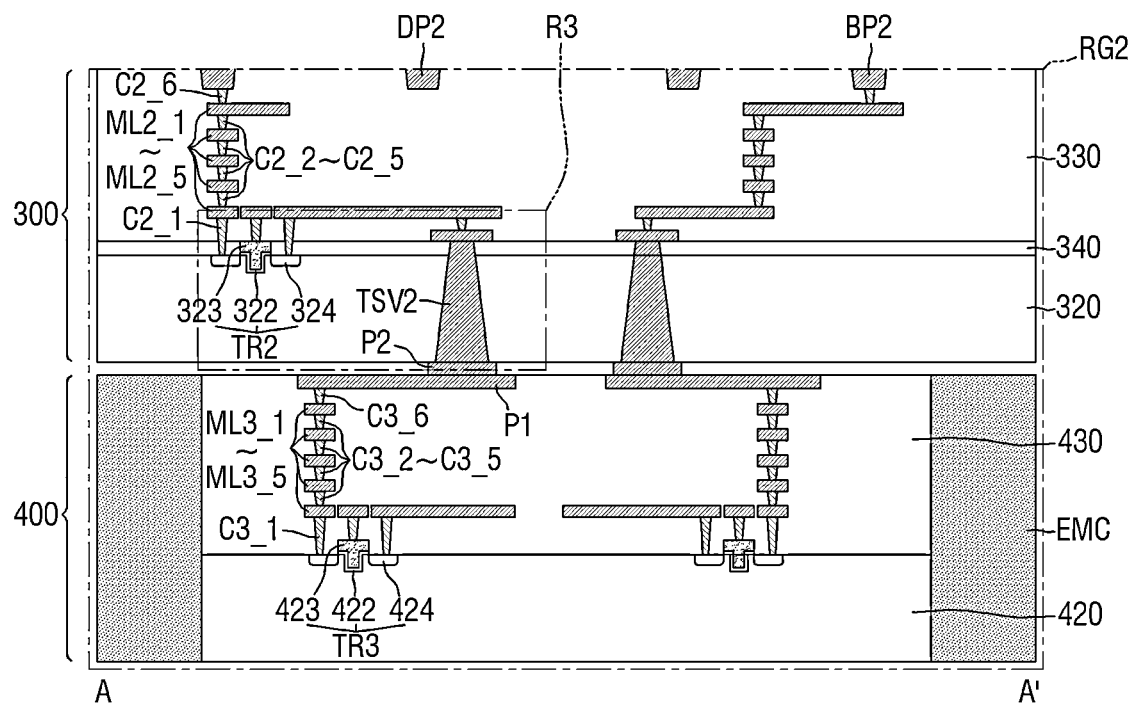
FIG. 11 is an enlarged view of region RG2 of FIG. 6.
Figure 12:
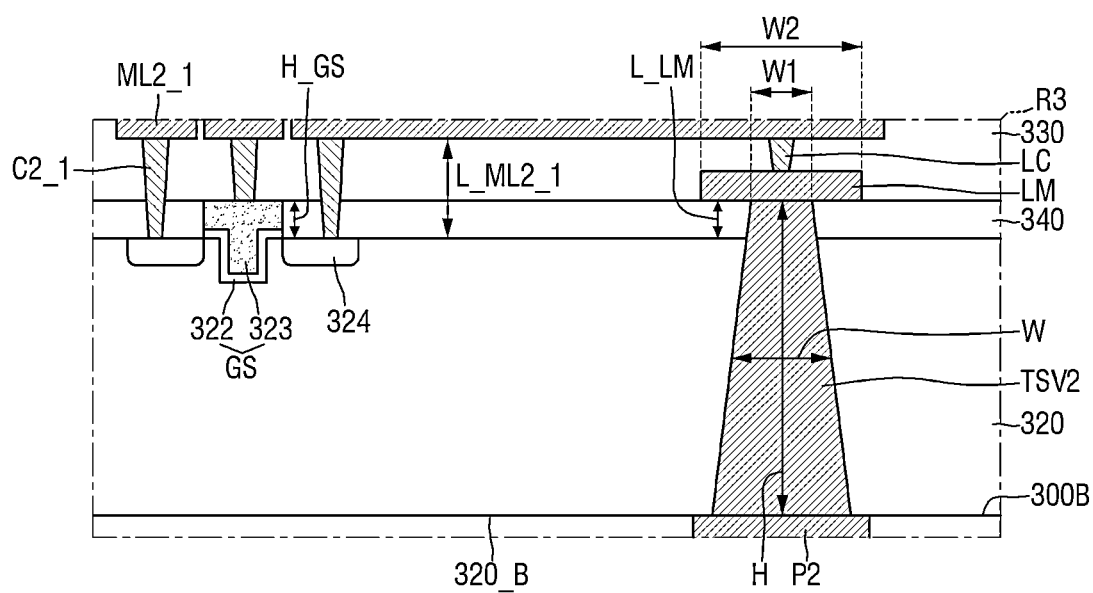
FIG. 12 is an enlarged view of region R3 of FIG. 11.

FIG. 5 is a top view of the image sensor 100a of FIG. 4. FIG. 6 is a cross-sectional view of the image sensor taken along line A-A' of FIG. 5. FIG. 7 is an enlarged view of region RG1 of FIG. 6. FIG. 8 is an enlarged view of region R1 of FIG. 7. FIGS. 9 and 10 are enlarged views of region R2 of FIG. 7. FIG. 11 is an enlarged view of region RG2 of FIG. 6. FIG. 12 is an enlarged view of region R3 of FIG. 11.

Referring to FIG. 5, the pixel array PA may be disposed on an upper surface of the image sensor 100a. In detail, the pixel array PA may be disposed on a back side 200B of the upper chip 200 of the image sensor 100a. Here, a first through via TSV1 may be disposed in an outer region of a region in which the pixel array PA is disposed, and here, at least some of bonding pads BP1 and BP2 and dummy pads DP1 and DP2 connecting the upper chip 200 and the intermediate chip 300 may be disposed to overlap the region, in which the pixel array PA is disposed, in a plan view. Micro lenses ML may be disposed in the region in which the pixel array PA is disposed. In the drawing, it is illustrated that only some of the bonding pads BP1 and BP2 are disposed in the region in which the pixel array PA is disposed, but the technical spirit of the present inventive concepts is not limited to the above arrangement.

Referring to FIGS. 6 to 12, the image sensor 100a may include the upper chip 200, the intermediate chip 300, and the lower chip 400. The lower chip 400, the intermediate chip 300, and the upper chip 200 may be sequentially stacked in the third direction Z.

The upper chip 200 may include a first semiconductor substrate 220, a photoelectric conversion layer 221, a first transistor TR1, a pixel separation pattern 225, and the like.

The first semiconductor substrate 220 may be, for example, bulk silicon or a silicon-on-insulator (SOI). The first semiconductor substrate 220 may be a silicon substrate or may include other materials, for example, silicon germanium, indium antimonide, a lead tellurium compound, indium arsenide, indium phosphide, gallium arsenide, or gallium antimonide. Alternatively, the first semiconductor substrate 220 may be a base substrate having an epitaxial layer formed thereon. The first semiconductor substrate 220 may include a front side and a back side opposite to each other. In some example embodiments, the back side of the first semiconductor substrate 220 may be a light receiving surface on which light is incident.

In some example embodiments, the first transistor TR1 may be disposed on the front side of the first semiconductor substrate 220. The first transistor TR1 may include at least some of various transistors (e.g., a transmission transistor, a reset transistor, a source follower transistor, a selection transistor, and the like) constituting a unit pixel of the image sensor.

The first transistor TR1 may include a gate insulating film 222, a gate electrode 223, and an impurity implantation region 224. The gate insulating film 222 may be formed along a trench formed in the first semiconductor substrate 220. The gate electrode 223 may fill a region defined by the gate insulating film 222. The impurity implantation region 224 may be formed by doping impurities into the first semiconductor substrate 220. Here, the gate electrode 223 may serve as a gate of the first transistor TR1, and the impurity implantation region 224 may serve as a source/drain of the first transistor TR1.

The pixel separation pattern 225 may be disposed in the first semiconductor substrate 220. The pixel separation pattern 225 may define a plurality of unit pixels. The unit pixels may be arranged two-dimensionally in a plane. For example, the pixel separation pattern 225 may be formed in a lattice shape when viewed in a plan view to separate the unit pixels from each other. The pixel separation pattern 225 may be formed by filling an insulating material in a deep trench formed by patterning the first semiconductor substrate 220.

In some example embodiments, the pixel separation pattern 225 may include an insulating spacer film 226 and a conductive filling pattern 227. The insulating spacer film 226 may conformally extend along a side surface of the trench in the first semiconductor substrate 220. The conductive filling pattern 227 may be formed on the insulating spacer film 226 to fill a portion of the trench in the first semiconductor substrate 220.

In addition, referring to FIG. 8, the pixel separation pattern 225 may be formed from the back side of the first semiconductor substrate 220. That is, a trench is formed on the back side of the first semiconductor substrate 220, the insulating spacer film 226 is formed in the formed trench, and the conductive filling pattern 227 is filled on the insulating spacer film 226, thereby forming the pixel separation pattern 225. The pixel separation pattern 225 may not be in contact (e.g., in direct contact) with the front side of the first semiconductor substrate 220. Here, the pixel separation pattern 225 may be a backside deep trench isolation (BDTI) structure.

Further, a pixel separation pattern 225' may be formed from the front side of the first semiconductor substrate 220. A trench may be formed on the front side of the first semiconductor substrate 220. Here, the trench formed from the front side may pass through the first semiconductor substrate 220. Thereafter, an insulating spacer film 226' may be formed in the trench, and a conductive filling pattern 227' is filled on the insulating spacer film 226', thereby forming the pixel separation pattern 225'. Here, the pixel separation pattern 225' may be a frontside deep trench isolation (FDTI) structure.

The unit pixel may include the photoelectric conversion layer 221. The photoelectric conversion layer 221 may be formed in (e.g., within) the first semiconductor substrate 220. The photoelectric conversion layer 221 may generate charges in proportion to the amount of light incident from the outside. The photoelectric conversion layer 221 may be formed by doping impurities into the first semiconductor substrate 220. For example, when the first semiconductor substrate 220 is doped with p-type impurities, the photoelectric conversion layer 221 may be doped with n-type impurities.

The upper chip 200 may include a surface insulating layer 210, a passivation layer 240, a grid pattern 250, a first liner 253, color filters CF, the micro lenses ML, a second liner 254, and the like.

The surface insulating layer 210 may be stacked on the back side of the first semiconductor substrate 220. The passivation layer 240 and a pad 241 may be stacked on the surface insulating layer 210. The pad 241 may be disposed on the first through via TSV1. An electrical signal may be transmitted and received through the pad 241 and the first through via TSV1.

The grid pattern 250, the first liner 253, the color filters CF, the micro lenses ML, and the second liner 254 may be disposed in regions defined by the surface insulating layer 210.

The color filters CF may be formed on the surface insulating layer 210. The color filters CF may be arranged to correspond to each unit pixel. Each of the color filters CF may be arranged two-dimensionally in a plane. The micro lens ML may be formed on the color filter CF. The micro lens ML may be arranged to correspond to each unit pixel. The micro lens ML may have a convex shape and may have a predetermined radius of curvature. Accordingly, the micro lens ML may collect light incident on the photoelectric conversion layer 221. The micro lens ML may include a light transmissive resin, but the present inventive concepts are not limited thereto.

The grid pattern 250 may be formed between the color filters CF. The grid pattern 250 may be formed on the surface insulating layer 210. The grid pattern 250 may include, for example, a metal pattern 251 and a low refractive index pattern 252. The metal pattern 251 and the low refractive index pattern 252 may be sequentially stacked on the surface insulating layer 210.

The first liner 253 may be formed on the surface insulating layer 210 and the grid pattern 250. The first liner 253 may extend along a surface of each of the surface insulating layer 210 and the grid pattern 250. The first liner 253 may include aluminum oxide, but the present inventive concepts are not limited thereto.

The second liner 254 may extend along a surface of the micro lens ML. The second liner 254 may include an inorganic oxide film (e.g., silicon oxide, titanium oxide, zirconium oxide, hafnium oxide, and combinations thereof), but the present inventive concepts are not limited thereto.

The upper chip 200 may include a first inter-line insulating layer 230, a plurality of first metal layers ML1_1 to ML1_5, a plurality of first contacts C1_1, C1_2 to C1_4, and C1_6, a first bonding pad BP1, a first dummy pad DP1, and the like.

The first inter-line insulating layer 230 may include at least one of silicon oxide, silicon nitride, silicon oxynitride, a low dielectric constant material having a dielectric constant lower than that of silicon oxide, and combinations thereof. Examples of the low dielectric constant material may include at least one among flowable oxide (FOX), tonen silazene (TOSZ), undoped silica glass (USG), borosilica glass (BSG), phosphosilica glass (PSG), borophosphosilicate glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutene (BCB), SiLK, polyimide, a porous polymeric material, and combinations thereof, but the present inventive concepts are not limited thereto.

The first metal layers ML1_1 to ML1_5 may be formed in the first inter-line insulating layer 230. The first metal layers ML1_1 to ML1_5 may be sequentially disposed from a surface on which the first transistor TR1 is located. For example, a 1_1$^{st}$ metal layer ML1_1 may be closest to the first transistor TR1, and a 1_5$^{th}$ metal layer ML1_5 may be disposed to be farthest away from the first transistor TR1. 1_2$^{nd}$ to 1_4$^{th}$ metal layers ML1_2 to ML1_4 may be disposed between the 1_1$^{st}$ metal layer ML1_1 and the 1_5$^{th}$ metal layer ML1_5. A thickness of each of the first metal layers ML1_1 to ML1_5 may be the same, but the example embodiments according to the technical spirit of the present inventive concepts are not limited thereto. In addition, the number of layers of the first metal layers ML1_1 to ML1_5 is illustrated in the drawing as five, but this is one example, and the number and arrangement of the first metal layers ML1_1 to ML1_5 may be variously changed and implemented.

The first metal layers ML1_1 to ML1_5 may be connected by the plurality of first contacts C1_1 to C1_5. For example, the first metal layer ML1_1 may be connected to the gate electrode 223 and the impurity implantation region 224 of the first transistor TR1 by a 1_1 contact C1_1, which is a gate contact and a source/drain contact. In addition, the first bonding pad BP1 is connected to and electrically connected to the first metal layers ML1_1 to ML1_5 through a 1_6$^{th}$ contact C1_6 that is farthest away from the first bonding pad BP1, and the first dummy pad DP1 is not in contact (e.g., not in direct contact) with a separate contact. Restated, the first dummy pad DP1 may be isolated from direct contact with a separate contact. Further, the first metal layers ML1_1 to ML1_5 may be in contact (e.g., in direct contact) with and electrically connected to the first through via TSV1 passing through the first semiconductor substrate 220 and a portion of the first inter-line insulating layer 230. The gate electrode 223 may include poly silicon (Poly-Si) or metal such as tungsten (W) and/or conductive metal nitride.

The first bonding pad BP1 and the first dummy pad DP1 are disposed on a front side 200A of the upper chip 200 and each has one surface exposed at the first inter-line insulating layer 230. In the upper chip 200 and the intermediate chip 300, one surface of each of the first bonding pad BP1 and the first dummy pad DP1 may be connected to that of each of a second bonding pad BP2 and a second dummy pad DP2 on a second inter-line insulating layer 330 to be described below.

In addition, referring to FIG. 9, the first bonding pad BP1 and the second bonding pad BP2 may be in contact (e.g., in direct contact) with each other in a staggered state on a first bonding surface BS1. For example, a portion of the first bonding pad BP1 may be in contact (e.g., in direct contact) with the second bonding pad BP2, but another portion of the first bonding pad BP1 may be in contact (e.g., in direct contact) with the second inter-line insulating layer 330. For example, a portion of the second bonding pad BP2 may be in contact (e.g., in direct contact) with the first bonding pad BP1, but another portion of the second bonding pad BP2 may be in contact (e.g., in direct contact) with the first inter-line insulating layer 230.

A first cavity CV1 may be formed between the first bonding pad BP1 and the first inter-line insulating layer 230. That is, the first cavity CV1 may mean an empty space surrounded by the first bonding pad BP1, the first inter-line insulating layer 230, and the second inter-line insulating layer 330. For example, as shown, the first inter-line insulating layer 230 may include one or more inner surfaces 230_I at least partially defining the first cavity CV1 that is surrounded by the first bonding pad BP1 and the first and second inter-line insulating layers 230 and 330. In addition, the empty space surrounded by the second bonding pad BP2, the first inter-line insulating layer 230, and the second inter-line insulating layer 330 may be a second cavity CV2. For example, as shown, the second inter-line insulating layer 330 may include one or more inner surfaces 330_I at least partially defining the second cavity CV2 that is surrounded by the second bonding pad BP2 and the first and second inter-line insulating layers 230 and 330. However, the example embodiments according to the technical spirit of the present inventive concepts are not limited thereto, and the first and second cavities CV1 and CV2 may not be formed.

Referring to FIG. 10 together, before the upper chip 200 and the intermediate chip 300 are bonded, the upper chip 200 may include the first cavity CV1 and a first cavity CV1', and the intermediate chip 300 may include the second cavity CV2 and a second cavity CV2'. As the upper chip 200 and the intermediate chip 300 are bonded, diffusion of a metal material may occur to remove the first cavity CV1' and the second cavity CV2'. However, the first and second cavities CV1 and CV2 may not cause diffusion of the metal material and thus may be maintained as they are.

Referring to FIG. 5 again, the first bonding pad BP1, the second bonding pad BP2, the first dummy pad DP1, and the second dummy pad DP2 may be disposed regardless of positions thereof in the image sensor 100a. That is, the first through via TSV1 of FIG. 5 is disposed in the region in which the pixel array PA of the image sensor 100a is not disposed, whereas the first bonding pad BP1, the second bonding pad BP2, the first dummy pad DP1, and the second dummy pad DP2 may also be formed in the region in which the pixel array PA is disposed.

The first metal layers ML1_1 to ML1_5 of each level and the first bonding pad BP1 may be connected by the plurality of first contacts C1_1, C1_2 to C1_5, and C1_6 of each level. Thus, an electrical signal transmitted from the photoelectric conversion layer 221 may be transmitted through the first transistor TR1, the first metal layers ML1_1 to ML1_5, the plurality of first contacts C1_1, C1_2 to C1_5, and C1_6, and the first bonding pad BP1.

The first metal layers ML1_1 to ML1_5 and the plurality of first contacts C1_1, C1_2 to C1_5, and C1_6 may each include a conductive material. For example, the first metal layers ML1_1 to ML1_5, the plurality of first contacts C1_1, C1_2 to C1_5, and C1_6, the first bonding pad BP1, and the first dummy pad DP1 may each include a metal material such as copper and lead.

The intermediate chip 300 may be disposed below the upper chip 200. That is, a front side 300A of the intermediate chip 300 and the front side 200A of the upper chip 200 may be in contact (e.g., in direct contact) with each other on the first bonding surface BS1.

Referring to FIG. 11, the intermediate chip 300 may include a second semiconductor substrate 320, a second transistor TR2, the second inter-line insulating layer 330, a landing insulating layer 340, a connection structure, and the like. The connection structure may be formed in the second inter-line insulating layer 330. The connection structure may include a plurality of second metal layers ML2_1 to ML2_5, a landing metal layer LM, a landing contact LC, a second through via TSV2, the second bonding pad BP2, the second dummy pad DP2, a plurality of second contacts C2_1, C2_2 to C2_5, and C2_6, and the like.

The second semiconductor substrate 320 may be, for example, bulk silicon or an SOI. The second semiconductor substrate 320 may be a silicon substrate or may include other materials, for example, silicon germanium, indium antimonide, a lead tellurium compound, indium arsenide, indium phosphide, gallium arsenide, or gallium antimonide.

The second transistor TR2 may be disposed on a front side of the second semiconductor substrate 320. The second transistor TR2 may be implemented and operated with logic elements such as, for example, the control register block 1110, the timing generator 1120, the row driver 1130, the readout circuit 1150, and the ramp signal generator 1160, or memory cells of the image sensor 100. The second transistor TR2 may include a gate insulating film 322, a gate electrode 323, and an impurity implantation region 324, and the gate insulating film 322 and the gate electrode 323 form a gate structure GS. The gate electrode 323 may include poly silicon (Poly-Si) or metal such as tungsten (W) and/or conductive metal nitride.

The second inter-line insulating layer 330 may include at least one of silicon oxide, silicon nitride, silicon oxynitride, a low dielectric constant material having a dielectric constant lower than that of silicon oxide, and combinations thereof. Examples of the low dielectric constant material may include at least one among flowable oxide (FOX), tonen silazene (TOSZ), undoped silica glass (USG), borosilica glass (BSG), phosphosilica glass (PSG), borophosphosilicate glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutene (BCB), SiLK, polyimide, a porous polymeric material, and combinations thereof, but the present inventive concepts are not limited thereto.

The second metal layers ML2_1 to ML2_5 may be formed in the second inter-line insulating layer 330. The second metal layers ML2_1 to ML2_5 may be sequentially disposed from a surface on which the second transistor TR2 is located. For example, a $2\_1^{st}$ metal layer ML2_1 may be closest to the second transistor TR2, and a 2_5 metal layer ML2_5 may be disposed to be farthest away from the second transistor TR2. $2\_2^{nd}$ to $2\_4^{th}$ metal layers ML2_2 to ML2_4 may be disposed between the $2\_1^{st}$ metal layer ML2_1 and the $2\_5^{th}$ metal layer ML2_5. A thickness of each of the second metal layers ML2_1 to ML2_5 may be the same, but the example embodiments according to the technical spirit of the present inventive concepts are not limited thereto. In addition, the number of layers of the second metal layers ML2_1 to ML2_5 is illustrated in the drawing as five, but this is one example, and the number and arrangement of the second metal layers ML2_1 to ML2_5 may be variously changed and implemented.

The second metal layers ML2_1 to ML2_5 may be connected by the plurality of second contacts C2_1 to C2_5. For example, the second metal layer ML2_1 may be connected to the gate electrode 323 and the impurity implantation region 324 of the second transistor TR2 by a $2\_1^{st}$ contact C2_1, which is a gate contact and a source/drain contact. In addition, the second bonding pad BP2 is connected to and electrically connected to the second metal layers ML2_1 to ML2_5 through a $2\_6^{th}$ contact C2_6 that is farthest away from the second bonding pad BP2, and the second bonding pad BP2 is not in contact (e.g., not in direct contact, isolated from direct contact) with a separate contact. Further, the second bonding pad BP2 and the second dummy pad DP2 are disposed on the front side 300a of the intermediate chip 300 and each has one surface exposed at the second inter-line insulating layer 330. An electrical signal may be connected through the first bonding pad BP1 and the second bonding pad BP2 so that the upper chip 200 and the intermediate chip 300 may be electrically connected to each other.

Referring to FIG. 12 together, the landing insulating layer 340 is disposed between the second semiconductor substrate 320 and the second inter-line insulating layer 330, and is disposed below the second metal layers ML2_1 to ML2_5 with respect to the second semiconductor substrate 320. The landing insulating layer 340 may include, for example, at least one among silicon oxide, silicon nitride, silicon oxynitride, a low dielectric constant material having a dielectric constant lower than that of silicon oxide, and combinations thereof, and may include a material different from that of the second inter-line insulating layer 330, but the present inventive concepts are not limited thereto.

The landing metal layer LM is disposed on the landing insulating layer 340, and the landing insulating layer 340 is disposed between the second semiconductor substrate 320 and the landing metal layer LM. The landing metal layer LM is disposed between the second semiconductor substrate 320 and the second metal layers ML2_1 to ML2_5, and in particular, the 2_1st contact C2_1, which is a gate contact directly connected to the gate structure GS of the second transistor TR2, is directly connected to the second metal layer ML2_1 that is nearest thereto, and the landing metal layer LM is disposed below the 2_1st metal layer ML2_1 with respect to the second semiconductor substrate 320. Thus, a separation distance L_ML2_1 between the second semiconductor substrate 320 and the 2_1st metal layer ML2_1 is greater than a separation distance L_LM between the second semiconductor substrate 320 and the landing metal layer LM.

The separation distance L_LM between the second semiconductor substrate 320 and the landing metal layer LM may be equal to a height H_GS of the gate structure GS of the second transistor TR2, and thus the height H_GS of the gate structure GS of the transistor TR2 may be equal to a height of an upper surface of the landing insulating layer 340.

In the present specification, the terms 'height' and 'level' may mean a vertical height and/or a distance from a reference location (e.g., the bottom surface 320_B of the second semiconductor substrate 320, a back side 300B of the intermediate chip 300 which is also referred to herein as a bottom surface of the intermediate chip 300, or the like) in a vertical direction (e.g., a direction that is perpendicular to the bottom surface 320_B of the second semiconductor substrate 320, a back side 300B of the intermediate chip 300 which is also referred to herein as bottom surface of the intermediate chip 300, or the like). A reference location may be understood to be a location that a height, level, and/or relative level of an element is "with respect to," "based on," or is a level "from." For example, when a first element is described herein to be at a height that is higher than a height of a second element, the first element may be further from the reference location in the vertical direction than the second element. In another example, when a first element is described herein to be at a height that is lower than a height of a second element, the first element may be closer to reference location in the vertical direction than the second element. In another example, when a first element is described herein to have a height that is equal to or matching a height of a second element, the first element may be equally distant from/close to the reference location in the vertical direction as the second element.

The landing contact LC may connect between the landing metal layer LM and the second metal layers ML2_1 to ML2_5, and in particular, may be directly connected to the landing metal layer LM and the 2_1st metal layer ML2_1.

The second through via TSV2 passes through the second semiconductor substrate 320 and the landing insulating layer 340, and extends in the third direction Z from a back side 300B of the intermediate chip 300 (e.g., extends in a vertical direction that is perpendicular to the back side 300B), and one surface of the second through via TSV2 is exposed at the back side 300B of the intermediate chip 300. The second through via TSV2 is in contact (e.g., in direct contact) with the landing metal layer LM, and electrically connected to the second metal layers ML2_1 to ML2_5 through the landing metal layer LM.

The second through via TSV2 may be a BDTI structure. A width W of the second through via TSV2 is reduced from the back side 300B of the intermediate chip 300 toward the front side 300A of the intermediate chip 300. Accordingly, a contact width W1 of the second through via TSV2 and the landing metal layer LM is equal to a minimum width of the second through via TSV2.

The plurality of second metal layers ML2_1 to ML2_5, the landing metal layer LM, the landing contact LC, the second through via TSV2, the second bonding pad BP2, the second dummy pad DP2, and the plurality of second contacts C2_1, C2_2 to C2_5, and C2_6 may each include a conductive material. The plurality of second metal layers ML2_1 to ML2_5, the landing metal layer LM, the landing contact LC, the second through via TSV2, the second bonding pad BP2, the second dummy pad DP2, and the plurality of second contacts C2_1, C2_2 to C2_5, and C2_6 may each include a metal material such as copper and lead.

The lower chip 400 may be disposed below the intermediate chip 300. The lower chip 400 may include a front side 400A and an opposite back side 400B. The lower chip 400 may include a first pad metal P1 and a second pad metal P2 electrically connected to each other, the second pad metal P2 is directly bonded to the exposed surface of the second through via TSV2, and the first pad metal P1 is partially exposed at a front side 400A of the lower chip 400. That is, the back side 300B of the intermediate chip 300 and the front side 400A of the lower chip 400 may be connected through the first pad metal P1 and the second pad metal P2.

The lower chip 400 may include a third semiconductor substrate 420, a third transistor TR3, a third inter-line insulating layer 430, a plurality of third metal layers ML3_1 to ML3_5, a plurality of third contacts C3_1, C3_2 to C3_5, and C3_6, a molding film EMC, and the like.

The third semiconductor substrate 420 may be, for example, bulk silicon or an SOI. The third semiconductor substrate 420 may be a silicon substrate or may include other materials, for example, silicon germanium, indium antimonide, a lead tellurium compound, indium arsenide, indium phosphide, gallium arsenide, or gallium antimonide.

The third transistor TR3 may be disposed on a front side of the third semiconductor substrate 420. The third transistor TR3 may be implemented and operated with logic elements such as, for example, the control register block 1110, the timing generator 1120, the row driver 1130, the readout circuit 1150, and the ramp signal generator 1160, or memory cells of the image sensor 100. The third transistor TR3 may include a gate insulating film 422, a gate electrode 423, and an impurity implantation region 424. The gate electrode 423 may include poly silicon (Poly-Si) or metal such as tungsten (W) and/or conductive metal nitride.

The third inter-line insulating layer 430 may include at least one of silicon oxide, silicon nitride, silicon oxynitride, low dielectric constant material having a lower dielectric constant than silicon oxide, and combinations thereof. Examples of the low dielectric constant material may include at least one among flowable oxide (FOX), tonen silazene (TOSZ), undoped silica glass (USG), borosilica glass (BSG), phosphosilica glass (PSG), borophosphosilicate glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutene (BCB), SiLK, polyimide, a porous polymeric material, and combinations of the above materials, but the present inventive concepts are not limited thereto.

The third metal layers ML3_1 to ML3_5 may be formed in the third inter-line insulating layer 430. The third metal layers ML3_1 to ML3_5 may be sequentially disposed from a surface on which the third transistor TR3 is located. For example, a 3_1st metal layer ML3_1 may be closest to the third transistor TR3, and a 3_5th metal layer ML3_5 may be disposed to be farthest away from the third transistor TR3. 3_2nd to 3_4th metal layers ML3_2 to ML3_4 may be disposed between the 3_1st metal layer ML3_1 and the 3_5th metal layer ML3_5. A thickness of each of the third metal layers ML3_1 to ML3_5 may be the same, but the example embodiments according to the technical spirit of the present inventive concepts are not limited thereto. In addition, the number of layers of the third metal layers ML3_1 to ML3_5 is illustrated in the drawing as five, but this is one example, and the number and arrangement of the third metal layers ML3_1 to ML3_5 may be variously changed and implemented.

The third metal layers ML3_1 to ML3_5 may be connected by the plurality of third contacts C3_1 to C3_5. For example, the third metal layers ML3_1 to ML3_5 may be connected to the gate electrode 423 and the impurity implantation region 424 of the third transistor TR3 by a 3_1st contact C3_1, which is a gate contact and a source/drain contact. In addition, the first pad metal P1 is connected to the third metal layers ML3_1 to ML3_5 through a 3_6th contact C3_6 that is farthest away from the first pad metal P1 to be electrically connected to the intermediate chip 300. The third metal layers ML3_1 to ML3_5 are illustrated in the drawing as being connected to the second pad metal P2 through the 3_6th contact C3_6 and the first pad metal P1, but may be connected to the second pad metal P2 through a through via extending in the third direction Z in the third inter-line insulating layer 430.

The plurality of third metal layers ML3_1 to ML3_5 and the plurality of third contacts C3_1, C3_2 to C3_5, and C3_6 may each include a conductive material. For example, the plurality of third metal layers ML3_1 to ML3_5 and the plurality of third contacts C3_1, C3_2 to C3_5, and C3_6 may each include a metal material such as copper and lead.

The molding film EMC may extend along a sidewall of each of the third semiconductor substrate 420 and the third inter-line insulating layer 430. That is, the molding film EMC may surround the third semiconductor substrate 420 and the third inter-line insulating layer 430. However, the molding film EMC may not cover an upper surface of the third inter-line insulating layer 430. The molding film EMC may protect the lower chip 400 from external interference and impact.

The image sensor 100 according to some example embodiments of the present inventive concepts includes the landing metal layer LM and the landing contact LC disposed between the second semiconductor substrate 320 and the second metal layers ML2_1 to ML2_5, so that a height H of the second through via TSV2, which passes through a back side of the second semiconductor substrate 320 through the second semiconductor substrate 320 and is electrically connected to the second metal layers ML2_1 to ML2_5, may be reduced.

As shown in FIG. 12, a width W of the through via TSV2 may become narrower (e.g., may decrease in the horizontal direction) as the width W of the through via TSV2 approaches a surface of the second inter-line insulating layer 330 that is in direct contact with the first inter-line insulating layer 230. Restated, a magnitude of a width W of a given cross-section of the through via TSV2 in the horizontal direction (e.g., a direction parallel to the back side 300B) may be proportional to a distance of the width W and/or cross-section from the surface of the second inter-line insulating layer 330 that is in direct contact with the first inter-line insulating layer 230 in the vertical direction (e.g., a direction perpendicular to the back side 300B). As the height H of the second through via TSV2 is reduced, the width W of the second through via TSV2 may also be reduced in the process, and thus a width W2 of the landing metal layer LM may be reduced, thereby reducing a line width of each of the second metal layers ML2_1 to ML2_5 closest to the second semiconductor substrate 320. Accordingly, the second metal layers ML2_1 to ML2_5 may provide a line having a reduced width and pitch to reduce a design rule for forming lines.

Figure 13:
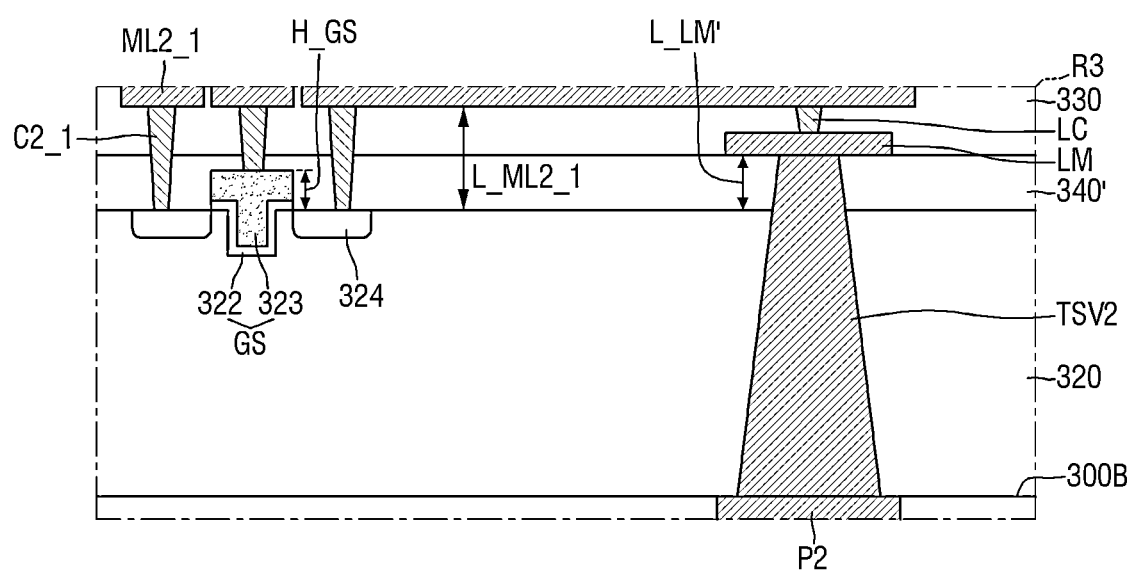
FIG. 13 is a view for describing an image sensor according to some other example embodiments of the present inventive concepts.

FIG. 13 is a view for describing an image sensor according to some other example embodiments of the present inventive concepts. For convenience of description, contents different from those described with reference to FIG. 12 will be mainly described with reference to FIG. 13.

A separation distance L_LM' between a second semiconductor substrate 320 and a landing metal layer LM may be formed to be greater than a height H_GS of a gate structure GS of a second transistor TR2, and thus a height of an upper surface of a landing insulating layer 340' is formed to be greater than that of the gate structure GS of the transistor TR2 with respect to the second semiconductor substrate 320, so that the landing insulating layer 340' covers the gate structure GS.

Figure 14:
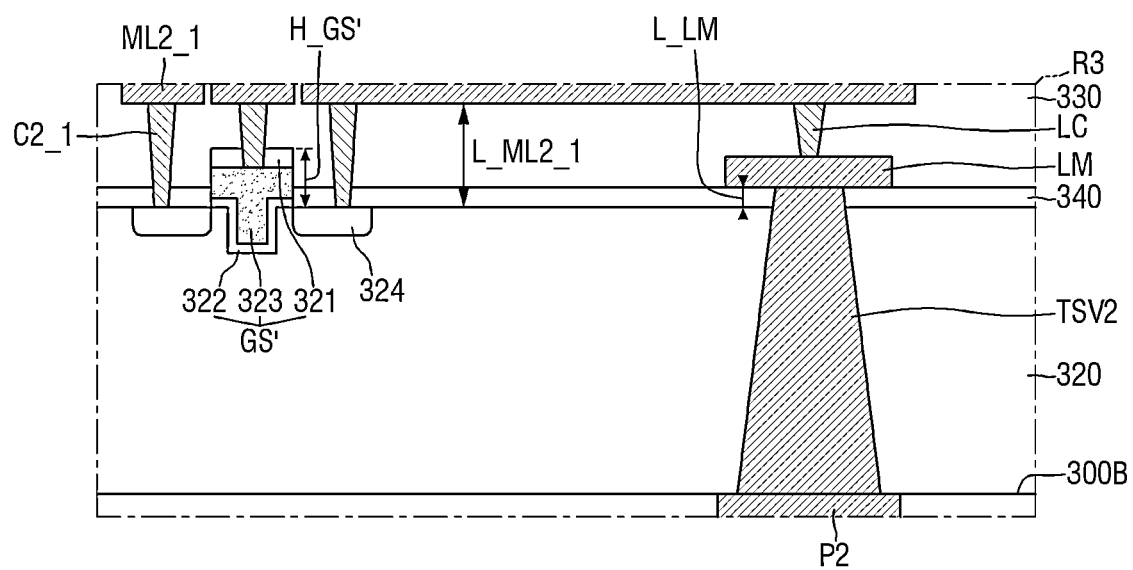
FIG. 14 is a view for describing an image sensor according to some other example embodiments of the present inventive concepts.

FIG. 14 is a view for describing an image sensor according to some other example embodiments of the present inventive concepts. For convenience of description, contents different from those described with reference to FIG. 12 will be mainly described with reference to FIG. 14.

A gate structure GS' further includes a capping pattern 321 disposed on a gate electrode 323. The capping pattern 321 may include silicon nitride, but the present inventive concepts are not limited thereto. The capping pattern 321 may include a material different from that of a landing insulating layer 340.

A separation distance L_LM between a second semiconductor substrate 320 and a landing metal layer LM may be formed to be less than a height H_GS' of the gate structure GS' of a second transistor TR2, and thus a height of an upper surface of a landing insulating layer 340 is formed to be less than that of the gate structure GS' of the transistor TR2 with respect to the second semiconductor substrate 320.

FIGS. 15, 16, 17, 18, 19, 20, and 21 are views illustrating intermediate processes of a method of manufacturing an image sensor according to some example embodiments of the present inventive concepts. FIGS. 15, 16, 17, 18, 19, 20, and 21 are views illustrating a manufacturing process of an intermediate chip 300 before an upper chip 200 is connected to a lower chip 400.

Figure 15:
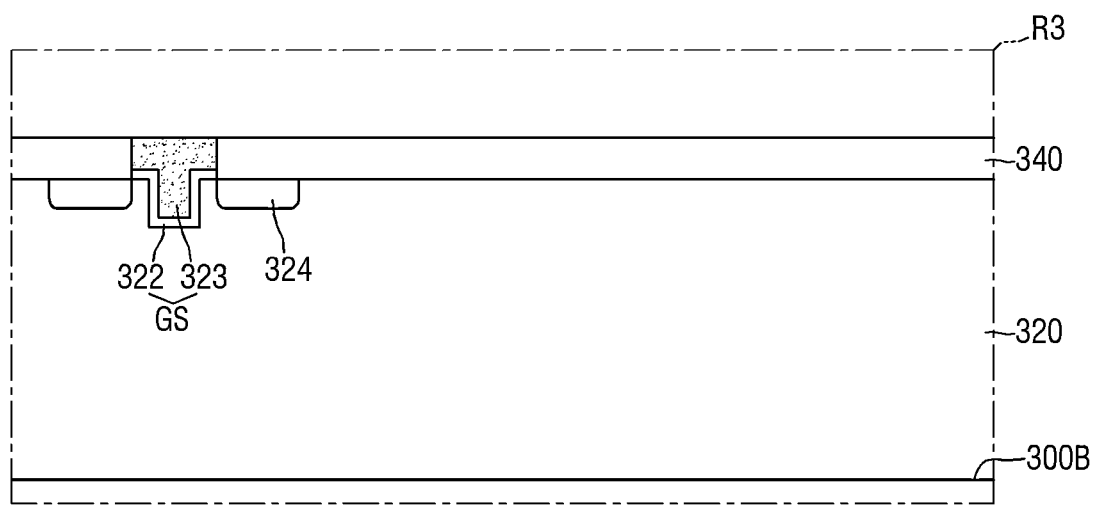
FIGS. 15, 16, 17, 18, 19, 20, and 21 are views illustrating intermediate processes of a method of manufacturing an image sensor according to some example embodiments of the present inventive concepts.

Referring to FIG. 15, a second transistor TR2 disposed on a front side of a second semiconductor substrate 320, and a landing insulating layer 340 covering the front side of the second semiconductor substrate 320 and surrounding a sidewall of the second transistor TR2 are formed.

A height of an upper surface of the landing insulating layer 340 may be the same as that of a gate structure GS of the second transistor TR2, but may vary depending on example embodiments.

Figure 16:
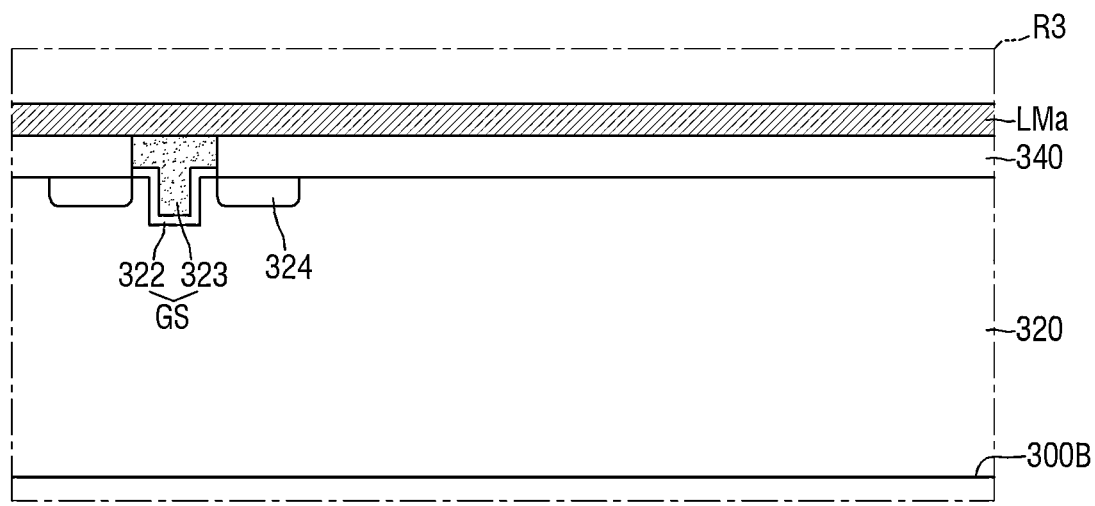

Referring to FIG. 16 together, a conductive material LMa covering the landing insulating layer 340 is formed. The conductive material LMa may be formed using physical vapor deposition (PVD), chemical vapor deposition (CVD), plasma enhanced CVD, atomic layer deposition, a damascene process, electroplating, or the like, but the technical spirit of the present inventive concepts are not limited to these examples.

Figure 17:
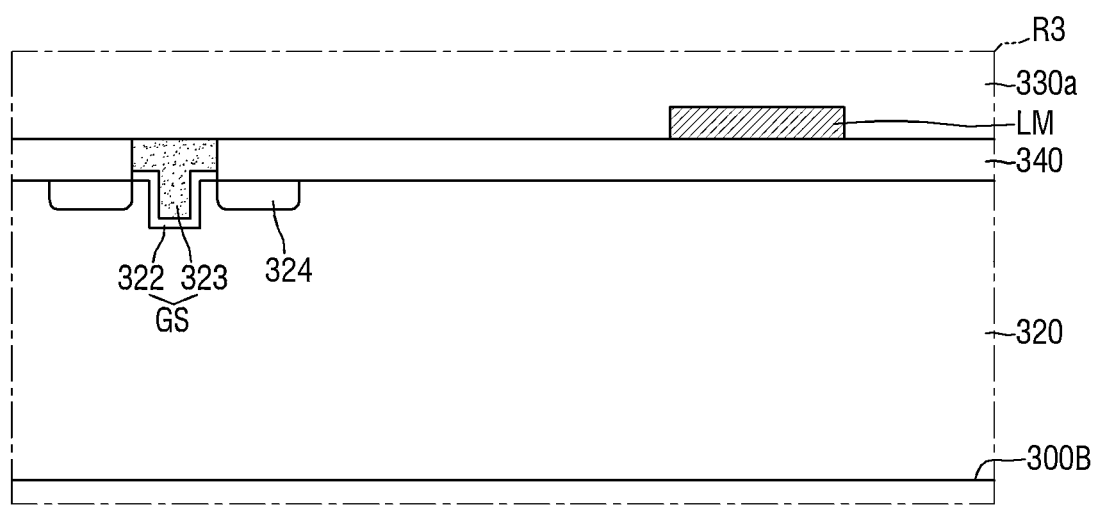

Referring to FIG. 17 together, a landing metal LM is formed by etching the conductive material LMa, and a pre inter-line insulating layer 330a covering the landing metal LM and the front side of the second semiconductor substrate 320 is formed. It will be appreciated that a description of a material of the pre inter-line insulating layer 330a may be replaced by that of a second inter-line insulating layer 330, which is given above.

The etching process may be performed through exposure/developing/etching processes using a photoresist but the present inventive concepts are not limited thereto.

Figure 18:
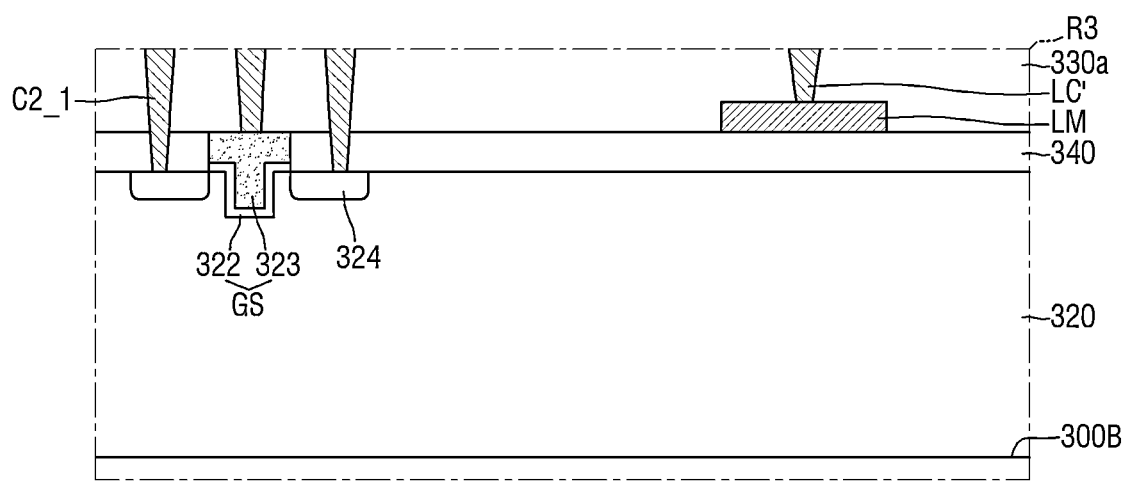

Referring to FIG. 18 together, a 2_1st contact C2_1 vertically passing through the landing insulating layer 340 and the pre inter-line insulating layer 330a, and a landing contact LC' are formed.

The process of forming the contacts C2_1 and LC' includes forming contact holes using exposure/developing/etching processes for a photoresist, and filling the contact holes with a conductive material. The conductive material may include metals such as tungsten (W), titanium (Ti), tantalum (Ta), copper (Cu), and aluminum (Al), but the present inventive concepts are not limited thereto.

Figure 19:
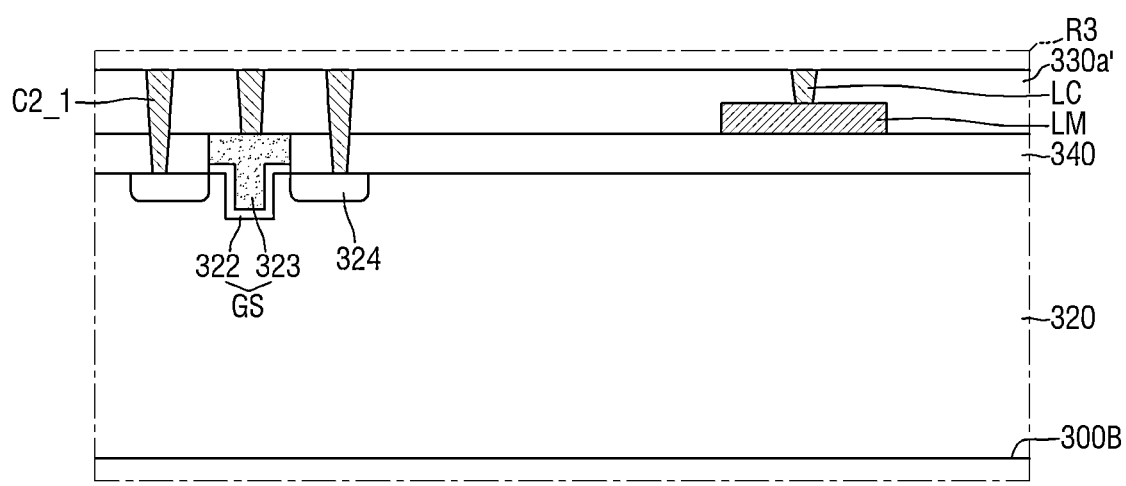

Referring to FIG. 19 together, a planarization process is performed on the 2_1st contact C2_1, the landing contact LC', and the pre inter-line insulating layer 330a. to form at least inter-line insulating layer 330a'.

Figure 20:
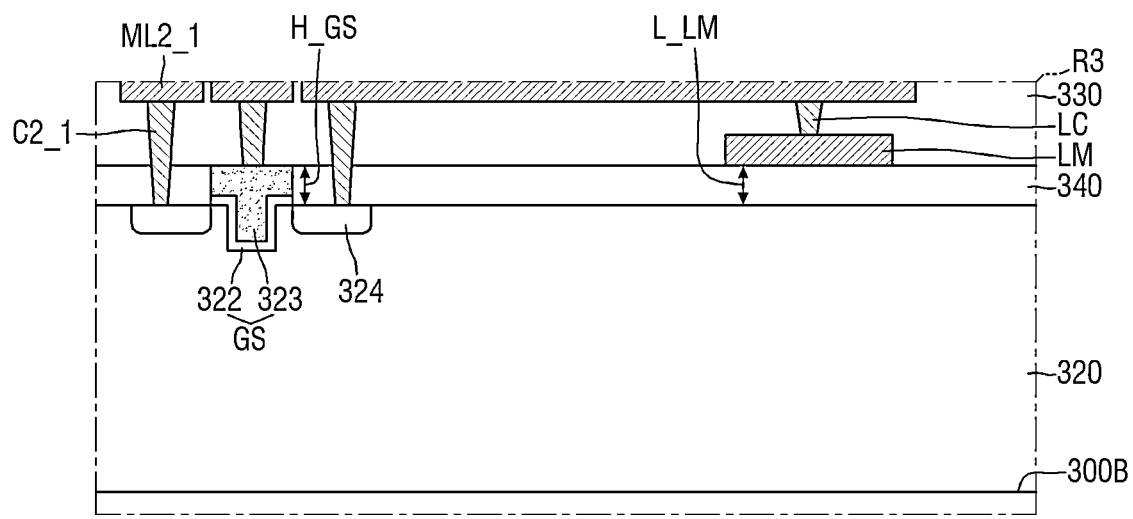
Figure 21:
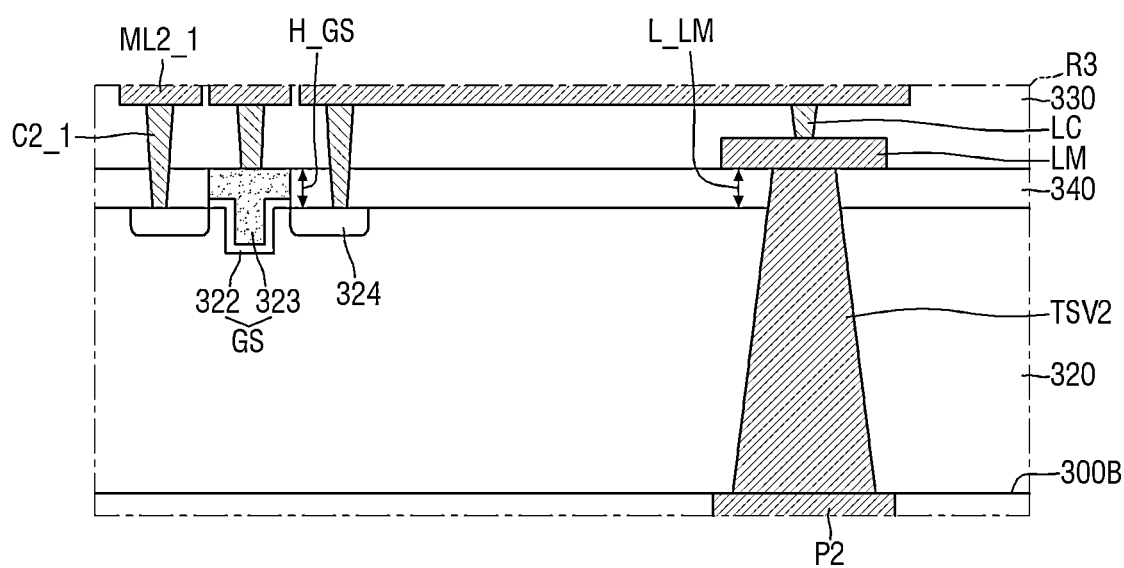

Referring to FIGS. 20 and 21 together, a second metal layer ML2_1 is formed on the 2_1st contact C2_1 and the landing contact LC', and a second through via TSV2 passing through the second semiconductor substrate 320 and the landing insulating layer 340 is formed.

The second through via TSV2 may extend from a back side of the second semiconductor substrate 320, and one surface of the second through via TSV2 may be exposed at a back side 300B of the intermediate chip 300, and thereafter, a second pad metal P2 may be bonded onto the exposed surface of the second through via TSV2.

Figure 22:
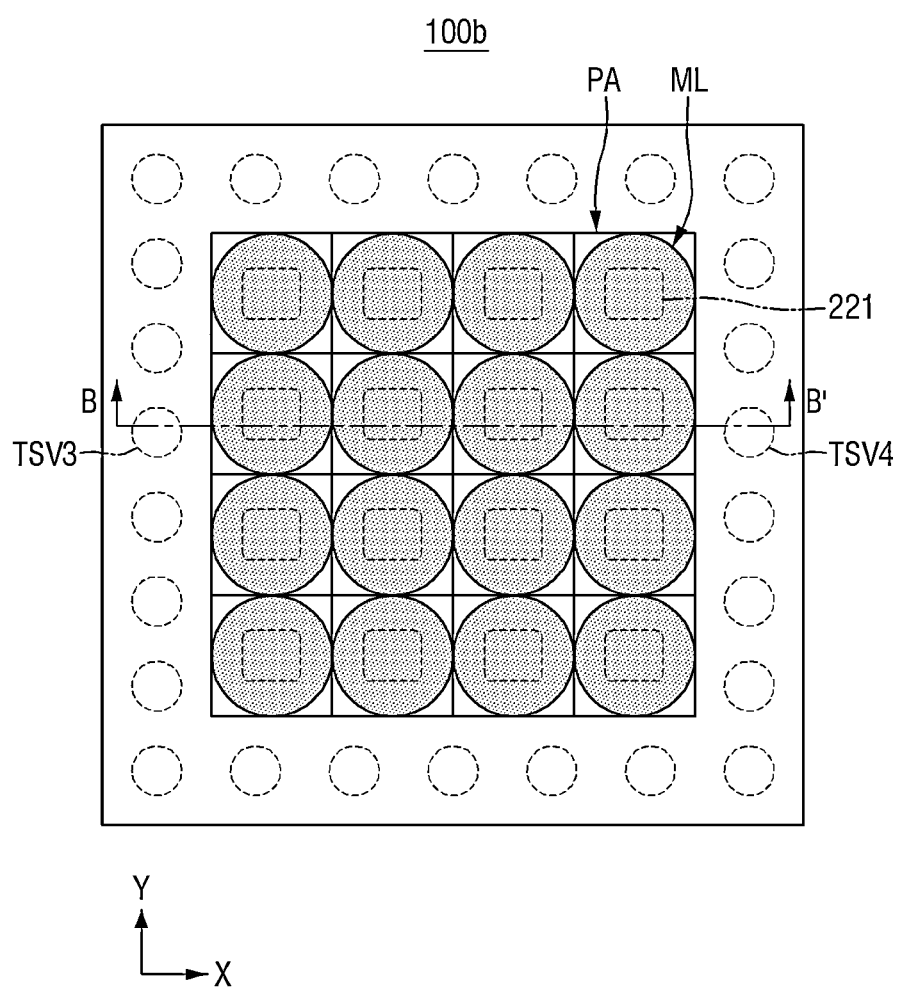
FIG. 22 is a top view of an image sensor according to some other example embodiments of the present inventive concepts.
Figure 23:
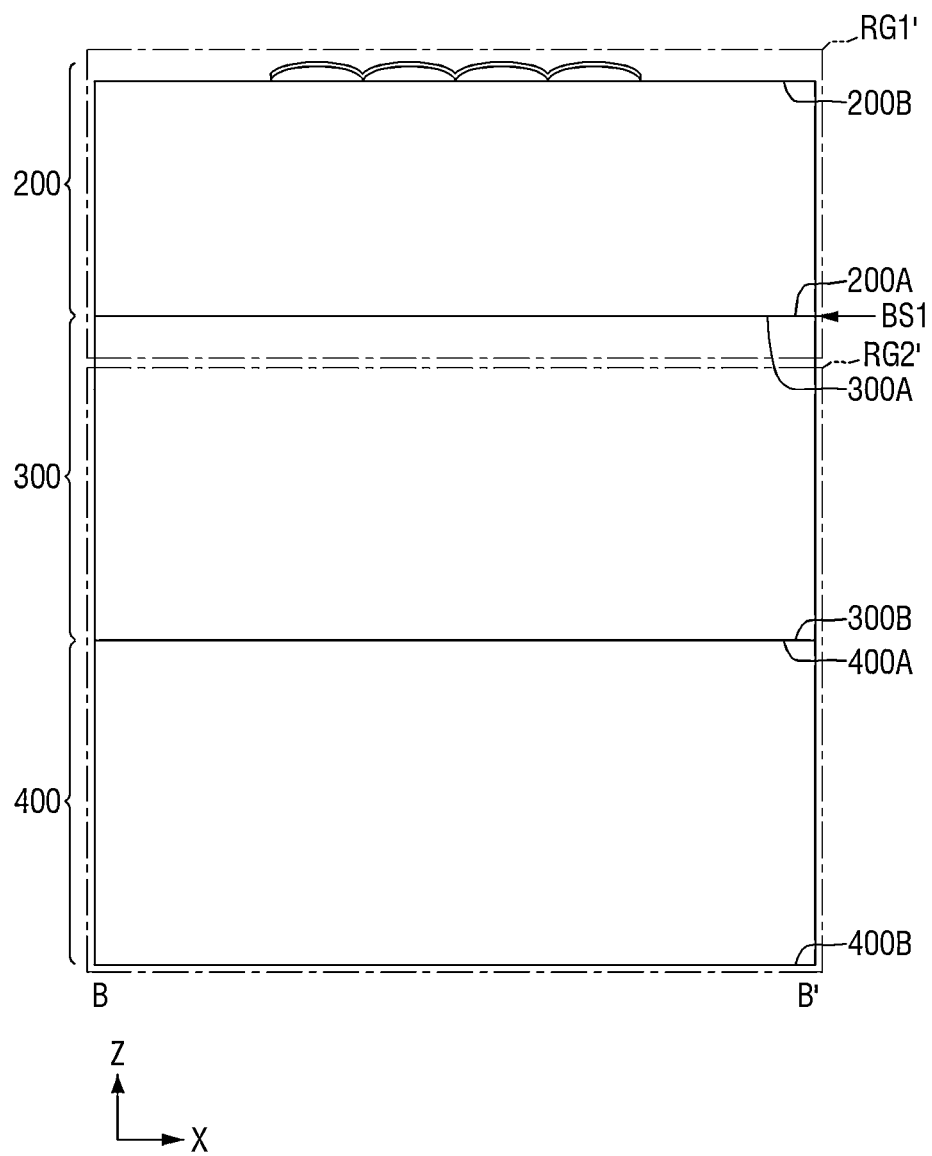
FIG. 23 is a cross-sectional view of the image sensor taken along line B-B' of FIG. 22.
Figure 24:
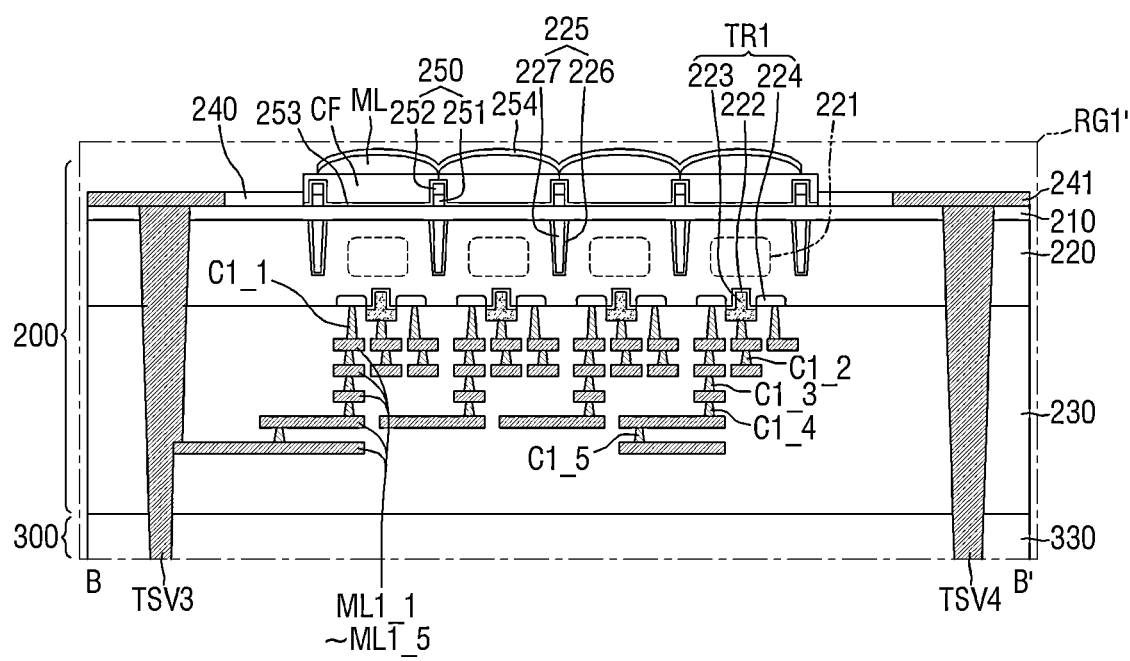
FIG. 24 is an enlarged view of region RG1' of FIG. 23.
Figure 25:
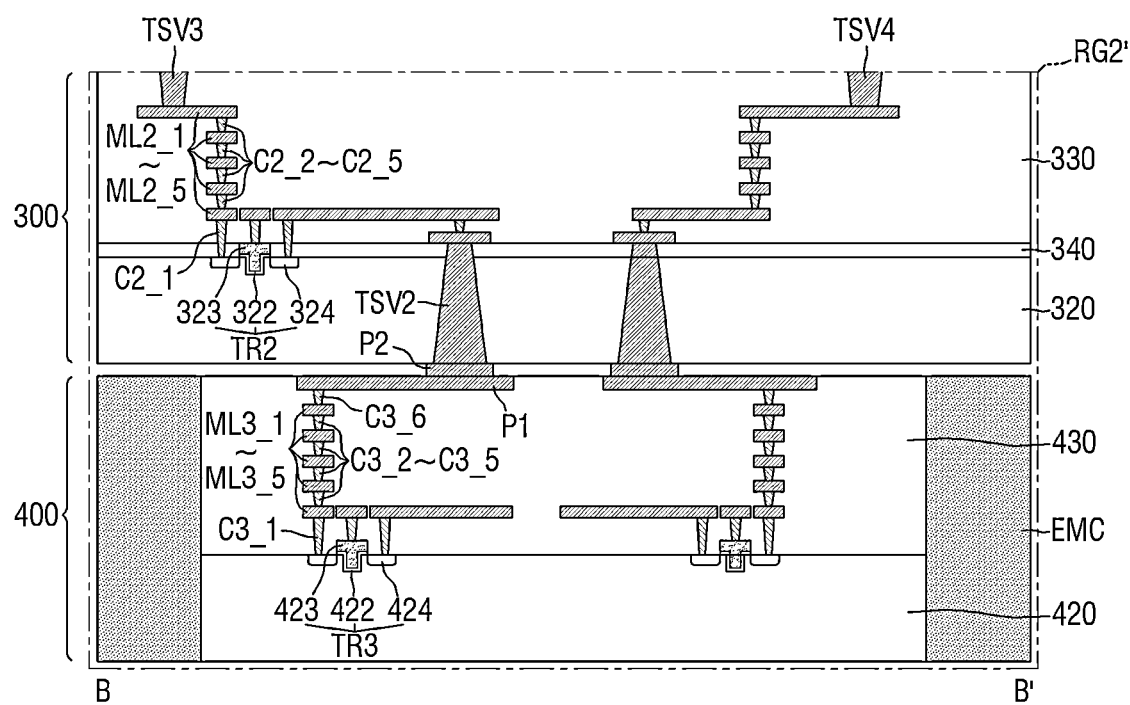
FIG. 25 is an enlarged view of region RG2' of FIG. 23.

FIG. 22 is a top view of an image sensor 100b according to some other example embodiments of the present inventive concepts. FIG. 23 is a cross-sectional view of the image sensor 100b taken along line B-B' of FIG. 22. FIG. 24 is an enlarged view of region RG1' of FIG. 23. FIG. 25 is an enlarged view of region RG2' of FIG. 23. For convenience of description, contents different from those described with reference to FIGS. 5 to 12 will be mainly described with reference to FIGS. 22 to 25.

Unlike the image sensor 100a described with reference to FIGS. 5 to 12, the image sensor 100b may not include a first bonding pad BP1, a second bonding pad BP2, a first dummy pad DP1, and a second dummy pad DP2.

In addition, the image sensor 100b may include third and fourth through vias TSV3 and TSV4 corresponding to the first through via TSV1 of the image sensor 100a. A description of the third and fourth through vias TSV3 and TSV4 may be replaced by the description of the first through via TSV1, and will be given focusing on differences.

An upper chip 200 and an intermediate chip 300 may be connected by the third and fourth through vias TSV3 and TSV4.

The third through via TSV3 may extend from a back side of the first semiconductor substrate 220. The third through via TSV3 may extend to second metal layers ML2_1 to ML2_5 of the intermediate chip 300. In addition, the third through via TSV3 may be connected to first metal layers ML1_1 to ML1_5 of the upper chip 200 and thus may connect the first metal layers ML1_1 to ML1_5 and the second metal layers ML2_1 to ML2_5. That is, the third through via TSV3 may be formed by filling a trench formed in an outer region of the upper chip 200 and the intermediate chip 300 with a conductive material, and the third through via TSV3 may connect the upper chip 200 and the intermediate chip 300. In addition, the third through via TSV3 may allow the upper chip 200 and the intermediate chip 300 to be fixed.

The fourth through via TSV4 may extend from an upper surface of the first semiconductor substrate 220. The fourth through via TSV4 may extend to the second metal layers ML2_1 to ML2_5 of the intermediate chip 300. The fourth through via TSV4 may be spaced apart from the third through via TSV3. The fourth through via TSV4 may be formed by filling a trench formed in an outer region of the upper chip 200 and the intermediate chip 300 with a conductive material, and the fourth through via TSV4 may connect the upper chip 200 and the intermediate chip 300. In addition, the fourth through via TSV4 may allow the upper chip 200 and the intermediate chip 300 to be fixed.

A pad 241 may be formed on the third and fourth through vias TSV3 and TSV4. The pad 241 may be connected to the third and fourth through vias TSV3 and TSV4 to transmit and receive electrical signals.

Figure 26:
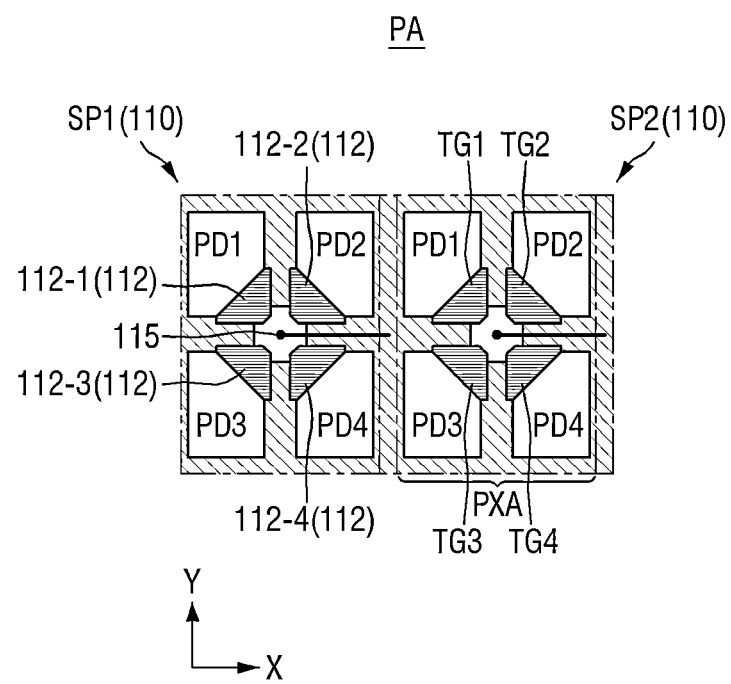
FIGS. 26 and 27 are views for describing an image sensor according to some other example embodiments of the present inventive concepts.
Figure 27:
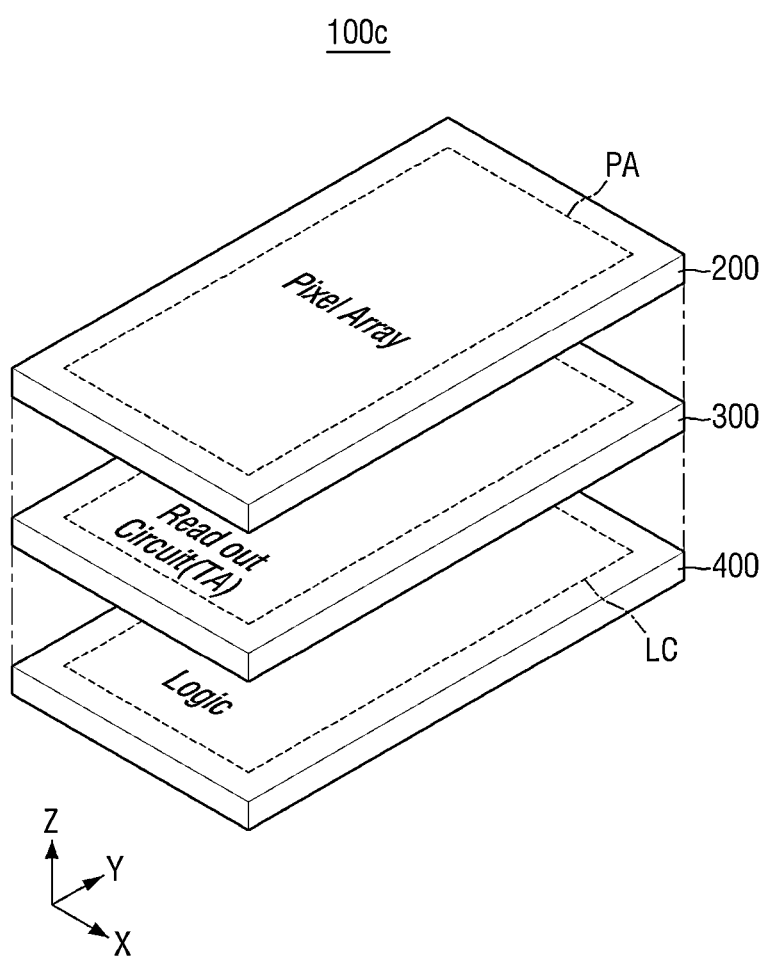

FIGS. 26 and 27 are views for describing an image sensor 100c according to some other example embodiments of the present inventive concepts. For convenience of description, contents different from those described with reference to FIGS. 3 and 4 will be mainly described with reference to FIGS. 26 and 27.

An intermediate chip 300 of the image sensor 100c according to some example embodiments may include a transistor region TA corresponding to the readout circuit 1150, and a lower chip 400 thereof may include a logic region LC.

Accordingly, the transistor region TA including transistors 114, 116, and 118 excluding transmission transistors 112 may overlap the pixel region PA in the third direction Z.

The lower chip 400 may include logic elements included in the logic region LC.

Figure 28:
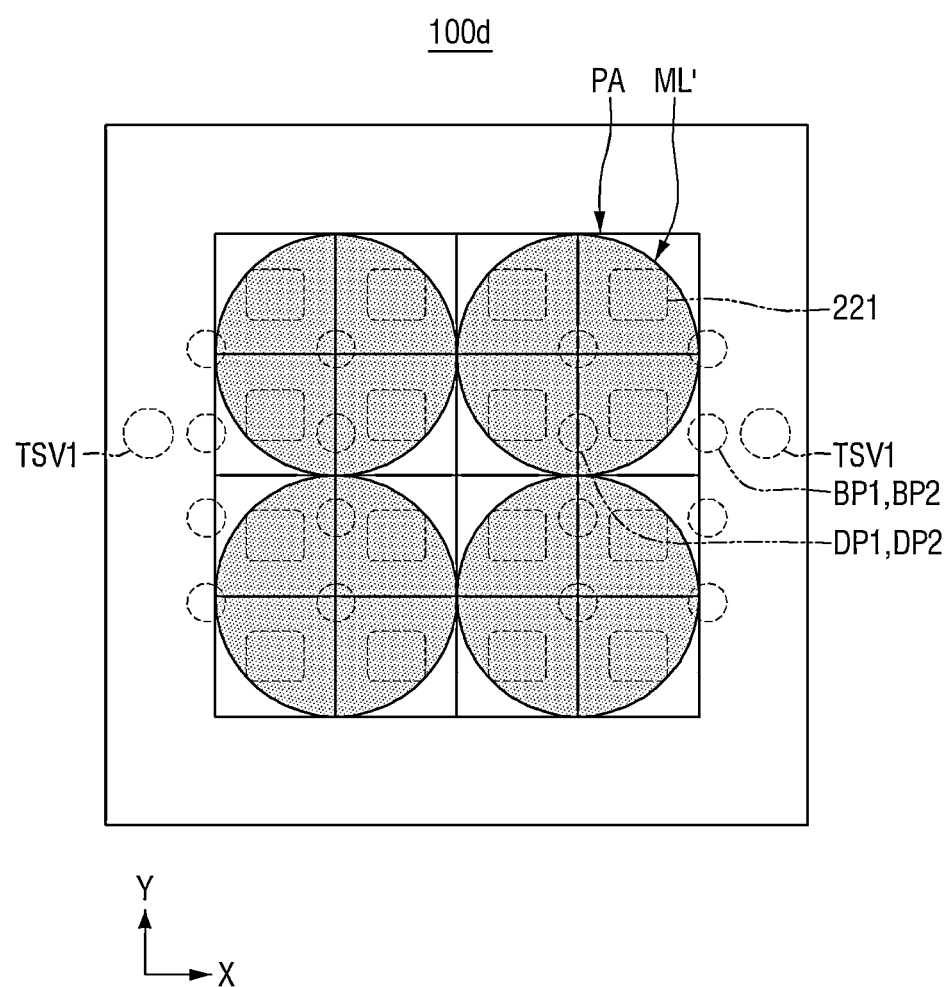
FIG. 28 is a view for describing an image sensor according to some other example embodiments of the present inventive concepts.

FIG. 28 is a view for describing an image sensor 100d according to some other example embodiments of the present inventive concepts. For convenience of description, contents different from those described with reference to FIG. 5 will be mainly described with reference to FIG. 28.

One micro lens ML' is disposed on a plurality of unit pixels arranged in a matrix form of 2×2 in the first direction X and the second direction Y.

A plurality of unit pixels disposed below the same micro lens ML' may include color filters CF of the same type, and the color filters CF may include a red color filter, a green color filter, and a white color filter, but the technical spirit of the present inventive concepts is not limited thereto.

Figure 29:
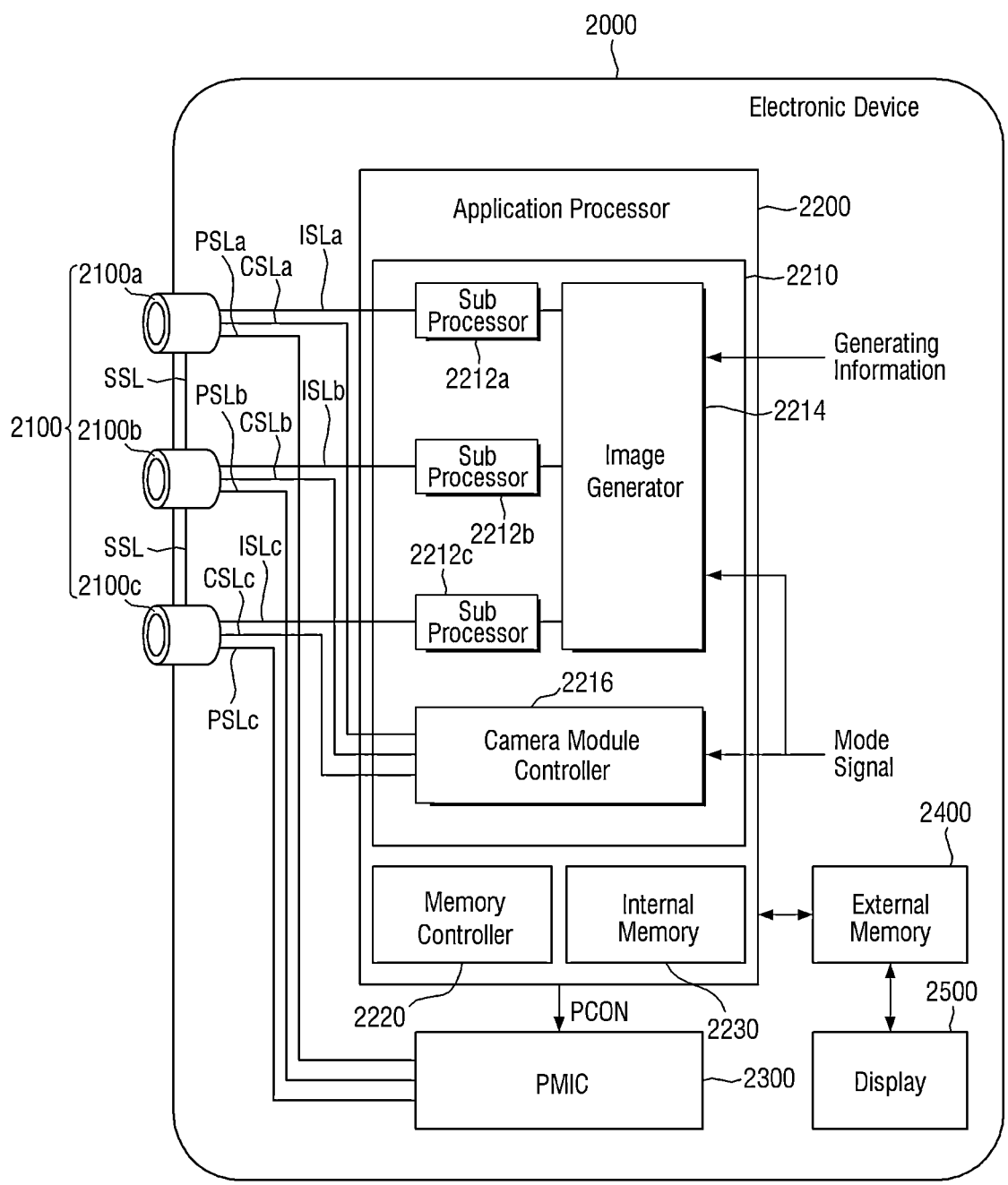
FIG. 29 is a block diagram for describing an electronic device including a multi-camera module according to some example embodiments.
Figure 30:
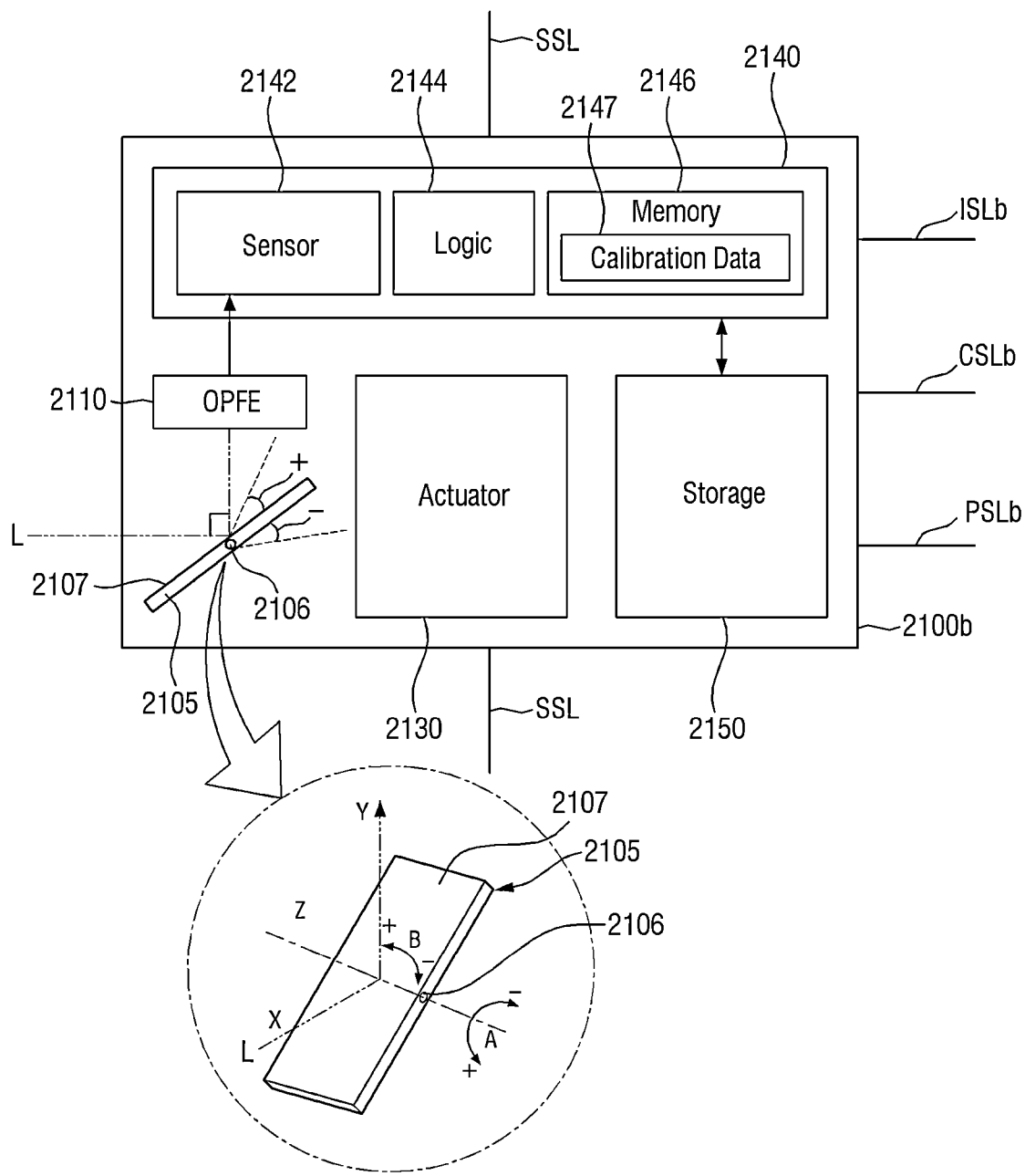
FIG. 30 is a detailed block diagram of the camera module of FIG. 29.

FIG. 29 is a block diagram for describing an electronic device including a multi-camera module according to some example embodiments. FIG. 30 is a detailed block diagram of the camera module of FIG. 29.

For convenience of description, descriptions of contents overlapping those described with reference to FIGS. 1 to 28 will be briefly made or omitted.

Referring to FIG. 29, an electronic device 2000 may include a camera module group 2100, an application processor 2200, a power management integrated circuit (PMIC) module 2300, an external memory 2400, and a display 2500.

The camera module group 2100 may include a plurality of camera modules 2100a, 2100b, and 2100c, also referred to herein as camera devices. Although some example embodiments in which three camera modules 2100a, 2100b, and 2100c are disposed is illustrated in the drawing, the example embodiments are not limited thereto. In some example embodiments, the camera module group 2100 may be modified to include only two camera modules. Further, in some example embodiments, the camera module group 2100 may be modified to include n (where n is a natural number greater than or equal to four) number of camera modules.

Here, one of the three camera modules 2100a, 2100b, and 2100c may be a camera module including the image sensor 100 described with reference to FIGS. 1 to 28.

Hereinafter, a detailed configuration of the camera module 2100b will be described in more detail with reference to FIG. 30, but the following description may be identically applied to other camera modules 2100a and 2100c according to some example embodiments.

Referring to FIG. 30, the camera module 2100b may include a prism 2105, an optical path folding element (hereinafter, referred to as "OPFE") 2110, an actuator 2130, an image sensing device 2140, and a storage 2150.

The prism 2105 may include a reflective surface 2107 including a light reflecting material and may change a path of light L incident from the outside.

In some example embodiments, the prism 2105 may change the path of the light L, which is incident in a first direction X, to a second direction Y perpendicular to the first direction X. In addition, the prism 2105 may rotate the reflective surface 2107 including the light reflecting material in an A direction about a central axis 2106, or rotate the central axis 2106 in a B direction to change the path of the light L, which is incident in the first direction X, to the second direction Y perpendicular to the path of the light L. In this case, the OPFE 2110 may move in a third direction Z perpendicular to the first direction X and the second direction Y.

In some example embodiments, as illustrated in the drawing, a maximum rotation angle of the prism 2105 in the A direction may be 15 degrees or less in a +A direction and may be greater than 15 degrees in a −A direction, but example embodiments are not limited thereto.

In some example embodiments, the prism 2105 may be moved about 20 degrees, 10 degrees to 20 degrees, or 15 degrees to 20 degrees in a +B or −B direction, and here, a moving angle may be the same in the +B or −B direction, or the prism 2105 may move up to an almost similar angle within a range of about 1 degree.

In some example embodiments, in the prism 2105, the reflective surface 2107 including the light reflecting material may be moved in a third direction (for example, a Z direction) parallel to an extension direction of the central axis 2106.

The OPFE 2110 may include, for example, m (where m is a natural number) number of optical lenses in groups. The m lenses may move in the second direction Y to change an optical zoom ratio of the camera module 2100b. For example, in a case in which a basic optical zoom ratio of the camera module 2100b is Z, when the m optical lenses included in the OPFE 2110 move, the optical zoom ratio of the camera module 2100b may be changed to an optical zoom ratio of 3Z or 5Z or higher.

The actuator 2130 may move the OPFE 2110 or the optical lens (hereinafter referred to as an optical lens) to a specific position. For example, the actuator 2130 may adjust a position of the optical lens so that an image sensor 2142 is positioned at a focal length of the optical lens for accurate sensing.

The image sensing device 2140 may include the image sensor 2142, a control logic 2144, and a memory 2146. The image sensor 2142 may sense an image of an object to be sensed using the light L provided through the optical lens. In some example embodiments, the image sensor 2142 may include the image sensor 100 described above.

The control logic 2144 may control overall operations of the camera module 2100b. For example, the control logic 2144 may control an operation of the camera module 2100b on the basis of a control signal provided through a control signal line CSLb.

The memory 2146 may store information necessary for an operation of the camera module 2100b, such as calibration data 2147. The calibration data 2147 may include information necessary for the camera module 2100b to generate image data using the light L provided from the outside. The calibration data 2147 may include, for example, information about the degree of rotation described above, information about the focal length, information about an optical axis, and the like. When the camera module 2100b is implemented as a multi-state camera in which a focal length thereof varies based on a position of an optical lens thereof, the calibration data 2147 may include a position-based (or state-based) focal length value of the optical lens and information associated with auto focusing. Here, the memory 2146 may include a variable resistance element VR1 described above. That is, the memory 2146 may include a memory cell MC including the variable resistance element VR1.

The storage 2150 may store image data sensed through the image sensor 2142. The storage 2150 may be disposed outside the image sensing device 2140 and may be implemented in a stacked form with a sensor chip configuring the image sensing device 2140. In some example embodiments, the storage 2150 may be implemented with an electrically erasable programmable read-only memory (EEPROM), but example embodiments are not limited thereto. The storage 2150 may be implemented by the intermediate chip 300 and/or the lower chip 400. The storage 2150 may include a memory cell MC including the variable resistance element VR1 described above.

Referring to FIGS. 29 and 30 together, in some example embodiments, each of the plurality of camera modules 2100a, 2100b, and 2100c may include the actuator 2130. Accordingly, each of the plurality of camera modules 2100a, 2100b, and 2100c may include the same or different calibration data 2147 according to the operation of the actuator 2130 included therein.

In some example embodiments, one camera module (e.g., the camera module 2100b) of the plurality of camera modules 2100a, 2100b, and 2100c may be a camera module of a folded lens type including the prism 2105 and the OPFE 2110 described above, and the other camera modules (for example, the camera modules 2100a and 2100c) may be vertical-type camera modules including no prism 2105 and OPFE 2110, but example embodiments are not limited thereto.

In some example embodiments, one camera module (e.g., the camera module 2100c) of the plurality of camera modules 2100a, 2100b, and 2100c may be a vertical-type depth camera that extracts depth information by using, for example, an infrared ray (IR). In this case, the application processor 2200 may merge the image data provided from the depth camera, and image data provided from another camera module (e.g., the camera module 2100a or 2100b) to generate a three-dimensional (3D) depth image.

In some example embodiments, at least two camera modules (e.g., the camera modules 2100a and 2100c) of the plurality of camera modules 2100a, 2100b, and 2100c may have different fields of view (viewing angles). In this case, for example, optical lenses of the at least two camera modules (e.g., the camera modules 2100a and 2100c) of the plurality of camera modules 2100a, 2100b, and 2100c may be different from each other, but the present inventive concepts are not limited thereto.

Also, in some example embodiments, the viewing angles of the plurality of camera modules 2100a, 2100b, and 2100c may be different from each other. In this case, the optical lenses included in the plurality of camera modules 2100a, 2100b, and 2100c may be different from each other, but the present inventive concepts are not limited thereto.

In some example embodiments, the plurality of camera modules 2100a, 2100b, and 2100c may be disposed to be physically separated from each other. That is, a sensing region of one image sensor 2142 may not be divided and used by the plurality of camera modules 2100a, 2100b, and 2100c, and an independent image sensor 2142 may be disposed in each of the plurality of camera modules 2100a, 2100b, and 2100c.

Referring to FIG. 29 again, the application processor 2200 may include an image processing device 2210, a memory controller 2220, and an internal memory 2230. The application processor 2200 may be implemented independently from the plurality of camera modules 2100a, 2100b, and 2100c. For example, the application processor 2200 and the plurality of camera modules 2100a, 2100b, and 2100c may be implemented as separate semiconductor chips separated from each other.

The image processing device 2210 may include a plurality of sub image processors 2212a, 2212b, and 2212c, an image generator 2214, and a camera module controller 2216.

The image processing device 2210 may include a number of sub image processors 2212a, 2212b, and 2212c corresponding to the number of the plurality of camera modules 2100a, 2100b, and 2100c.

Pieces of image data generated from the camera modules 2100a, 2100b, and 2100c may be respectively provided to the sub image processors 2212a, 2212b, and 2212c through separate image signal lines ISLa, ISLb, and ISLc. For example, image data generated from the camera module 2100a may be provided to the sub image processor 2212a through the image signal line ISLa, image data generated from the camera module 2100b may be provided to the sub image processor 2212b through the image signal line ISLb, and image data generated from the camera module 2100c may be provided to the sub image processor 2212c through the image signal line ISLc. Such image data transmission may be performed by using, for example, a camera serial interface (CSI) based on a mobile industry processor interface (MIPI), but example embodiments are not limited thereto.

Meanwhile, in some example embodiments, one sub image processor may be disposed to correspond to a plurality of camera modules. For example, the sub image processor 2212a and the sub image processor 2212c may not be implemented apart from each other like that illustrated in the drawing and may be integrated into one sub image processor, and the image data provided from each of the camera modules 2100a and 2100c may be selected through a selection element or the like (for example, a multiplexer) and may be provided to an integrated sub image processor.

The image data provided to each of the sub image processors 2212a, 2212b, and 2212c may be provided to the image generator 2214. The image generator 2214 may generate an output image using the image data provided from each of the sub image processors 2212a, 2212b, and 2212c on the basis of image generation information or a mode signal.

Specifically, the image generator 2214 may merge at least some of the pieces of the image data generated from the camera modules 2100a, 2100b, and 2100c having different viewing angles to generate the output image on the basis of the image generation information or the mode signal. In addition, the image generator 2214 may select one piece of image data among the pieces of image data generated from the camera modules 2100a, 2100b, and 2100c having different viewing angles to generate the output image on the basis of the image generation information and the mode signal.

In some example embodiments, the image generation information may include a zoom signal or zoom factor. In addition, in some example embodiments, the mode signal may be, for example, a signal based on a mode selected by a user.

When the image generation information is a zoom signal (a zoom factor) and the camera modules 2100a, 2100b, and 2100c have different fields of view (viewing angles), the image generator 2214 may perform different operations on the basis of the type of zoom signal. For example, when the zoom signal is a first signal, the image generator 2214 may merge the image data output from the camera module 2100a and the image data output from the camera module 2100c, and then, may generate the output image by using a merged image signal and the image data that is not used for the merging and is output from the camera module 2100b. When the zoom signal is a second signal different from the first signal, the image generator 2214 may not perform merging of pieces of image data and may select one piece of image data from among the pieces of image data output provided from the camera modules 2100a, 2100b, and 2100c to generate the output image. However, example embodiments are not limited thereto, and depending on the case, a method of processing image data may be variously modified.

In some example embodiments, the image generator 2214 may receive pieces of image data having different exposure times from at least one of the plurality of sub image processors 2212a, 2212b, and 2212c and may perform high dynamic range (HDR) processing on the pieces of image data to generate merged image data in which a dynamic range has increased.

The camera module controller 2216 may provide a control signal to each camera module 2100a, 2100b, and 2100c. The control signal generated by the camera module controller 2216 may be provided to the camera modules 2100a, 2100b, and 2100c through the separate control signal lines CSLa, CSLb, and CSLc.

One of the plurality of camera modules 2100a, 2100b, and 2100c may be designated as a master camera (e.g., the camera module 2100a) on the basis of the mode signal or the image generation information including the zoom signal, and the other camera modules (e.g., the camera modules 2100b and 2100c) may be designated as slave cameras. Such information may be included in the control signal and may be provided to the corresponding camera modules 2100a, 2100b, and 2100c through the separate control signal lines CSLa, CSLb, and CSLc.

A camera module operating as a master or slave may be changed according to the zoom factor or an operation mode signal. For example, when a viewing angle of the camera module 2100a is broader than a viewing angle of the camera module 2100c, and the zoom factor represents a low zoom ratio, the camera module 2100c may operate as a master and the camera module 2100a may operate as a slave. In contrast, when the zoom factor represents a high zoom ratio, the camera module 2100a may operate as a master and the camera module 2100c may operate as a slave.

In some example embodiments, the control signal provided from the camera module controller 2216 to each of the camera modules 2100a, 2100b, and 2100c may include a sync enable signal. For example, when the camera module 2100b is a master camera, and the camera modules 2100a and 2100c are slave cameras, the camera module controller 2216 may transmit the sync enable signal to the camera module 2100b. The camera module 2100b receiving the sync enable signal may generate a sync signal on the basis of the received sync enable signal, and may provide the generated sync signal to the camera modules 2100a and 2100c through a sync signal line SSL. The camera module 2100b and the camera modules 2100a and 2100c may transmit the image data to the application processor 2200 in synchronization with the sync signal.

In some example embodiments, the control signal provided from the camera module controller 2216 to the plurality of camera modules 2100a, 2100b, and 2100c may include mode information based on the mode signal. Based on the mode information, the plurality of camera modules 2100a, 2100b, and 2100c may operate in a first operation mode and a second operation mode in association with a sensing speed.

In the first operation mode, the plurality of camera modules 2100a, 2100b, and 2100c may generate an image signal at a first speed (for example, generate an image signal having a first frame rate), encode the image signal at a second speed higher than the first speed (for example, encode the image signal to have a second frame rate that is higher than the first frame rate), and transmit the encoded image signal to the application processor 2200. In this case, the second speed may be less than or equal to 30 times the first speed.

The application processor 2200 may store the received image signal (i.e., the encoded image signal) in the internal memory 2230 included therein or the external memory 2400 provided outside the application processor 2200, and then, may read and decode the encoded image signal from the internal memory 2230 or the external memory 2400 and may display image data generated based on the decoded image signal. For example, a corresponding sub-processor among the plurality of sub image processors 2212a, 2212b, and 2212c of the image processing device 2210 may perform decoding and may perform image processing on the decoded image signal. For example, image data generated based on the image signal decoded may be displayed in the display 2500.

In the second operation mode, the plurality of camera modules 2100a, 2100b, and 2100c may generate an image signal at a third speed lower than the first speed (for example, generate an image signal having a third frame rate that is lower than the first frame rate), and transmit the generated image signal to the application processor 2200. The image signal provided to the application processor 2200 may be a signal that is not encoded. The application processor 2200 may perform image processing on the received image signal, or may store the image-processed image signal in the internal memory 2230 or the external memory 2400.

The PMIC 2300 may supply power (e.g., a power supply voltage) to each of the plurality of camera modules 2100a, 2100b, and 2100c. For example, under the control by the application processor 2200, the PMIC 2300 may supply first power to the camera module 2100a through a power signal line PSLa, supply second power to the camera module 2100b through a power signal line PSLb, and supply third power to the camera module 2100c through a power signal line PSLc.

In response to a power control signal PCON from the application processor 2200, the PMIC 2300 may generate power corresponding to each of the plurality of camera modules 2100a, 2100b, and 2100c and may adjust a level of the power. The power control signal PCON may include a power adjustment signal for an operation mode of each of the plurality of camera modules 2100a, 2100b, and 2100c. For example, the operation mode may include a low power mode, and in this case, the power control signal PCON may include information about a camera module operating based on the low power mode and information about a set power level. Levels of power provided to the plurality of camera modules 2100a, 2100b, and 2100c may be the same or different from each other. Further, the levels of the power may dynamically vary.

As described herein, any devices, electronic devices, controllers, modules, units, and/or portions thereof according to any of the example embodiments, and/or any portions thereof (including, without limitation, image sensing device 1, image sensor 100, control register block 1110, timing generator 1120, row driver 1130, readout circuit 1150, ramp signal generator 1160, buffer 1170, image signal processor 900, upper chip 200, intermediate chip 300, lower chip 400, electronic device 2000, camera modules 2100a, 2100b, 2100c, application processor 2200, image processing device 2210, image generator 2214, sub image processors 2212a, 2212b, 2212c, camera module controller 2216, memory controller 2220, PMIC 2300, external memory 2400, internal memory 2230, display 2500, image sensing device 2140, control logic 2144, image sensor 2142, memory 2146, storage 2150, OPFE 2110, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, electronic devices, modules, units, and/or portions thereof according to any of the example embodiments.

Any of the memories described herein, including, without limitation, internal memory 2230, external memory 2400, memory 2146, and/or storage 2150 may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

In concluding the detailed description, those skilled in the art will appreciate that many variations and modifications may be made to the above-described example embodiments without substantially departing from the principles of the present inventive concepts. Therefore, the above-described example embodiments of the inventive concepts are used in a generic and descriptive sense only and not for purposes of limitation.

What is claimed is:
1. An image sensor, comprising:
a sequential stack of a first chip and a second chip,
wherein the first chip includes
a first semiconductor substrate including a first surface and a second surface opposite to the first surface,
a photoelectric conversion layer in the first semiconductor substrate,
a color filter on the first surface,
a micro lens covering the color filter,
a first transistor on the second surface of the first semiconductor substrate and adjacent to the photoelectric conversion layer,
a first insulating layer on the second surface, and
a first metal layer in the first insulating layer and connected to the first transistor, wherein the second chip includes
a second insulating layer including a third surface in direct contact with the first insulating layer and a fourth surface opposite to the third surface,
a second semiconductor substrate on the fourth surface of the second insulating layer,
a second transistor on the second semiconductor substrate,
a second metal layer in the second insulating layer and connected to a gate structure of the second transistor through a gate contact,
a landing metal layer below the second metal layer with respect to the second semiconductor substrate, and
a through via in direct contact with the landing metal layer and vertically passing through the second semiconductor substrate, and wherein a width of the through via becomes narrower as the width of the through via approaches the third surface.

2. The image sensor of claim 1, wherein the second chip further includes a third insulating layer between the second semiconductor substrate and the landing metal layer.

3. The image sensor of claim 2, wherein
the third insulating layer is in direct contact with a lower surface of the landing metal layer, and
a height of an upper surface of the third insulating layer is equal to a height of an upper surface of the gate structure with respect to a bottom surface of the second chip.

4. The image sensor of claim 2, wherein
the third insulating layer is in direct contact with a lower surface of the landing metal layer, and
the third insulating layer covers the gate structure.

5. The image sensor of claim 2, wherein
the third insulating layer is in direct contact with a lower surface of the landing metal layer, and
an upper surface of the third insulating layer is lower than an upper surface of the gate structure with respect to the second semiconductor substrate.

6. The image sensor of claim 5, wherein the gate structure includes a gate electrode and a capping pattern on the gate electrode.

7. The image sensor of claim 1, further comprising a third chip connected to the second chip through a pad metal,
wherein the pad metal is in direct contact with the through via.

8. The image sensor of claim 1, wherein the gate contact is directly connected to the gate structure and the second metal layer.

9. The image sensor of claim 1, wherein
the first chip includes a first bonding pad electrically connected to the first metal layer, the first bonding pad being in the first insulating layer, the first bonding pad having one surface exposed on the first insulating layer,
the second chip includes a second bonding pad electrically connected to the second metal layer, the second bonding pad being in the second insulating layer, the second bonding pad having one surface exposed on the third surface of the second insulating layer, and
the first bonding pad is in direct contact with the second bonding pad.

10. An image sensor, comprising:
a sequential stack of a first chip, a second chip, and a third chip; and
a pad metal connecting the second chip and the third chip,
wherein the first chip includes
a first semiconductor substrate including a first surface and a second surface opposite to the first surface,
a photoelectric conversion layer in the first semiconductor substrate,
a color filter on the first surface,
a micro lens covering the color filter,
a first transistor on the second surface of the first semiconductor substrate and adjacent to the photoelectric conversion layer,
a first insulating layer on the second surface, and
a first metal layer in the first insulating layer and connected to the first transistor,
wherein the second chip includes
a second insulating layer including a third surface in direct contact with the first insulating layer and a fourth surface opposite to the third surface;
a second semiconductor substrate on the fourth surface of the second insulating layer,
a second transistor on the second semiconductor substrate,
a second metal layer in the second insulating layer and connected to a gate structure of the second transistor through a gate contact,
a landing metal layer below the second metal layer with respect to the second semiconductor substrate, and
a through via in direct contact with the landing metal layer and vertically passing through the second semiconductor substrate,
wherein the third chip includes
a third insulating layer including a fifth surface on which a pad in direct contact with the through via is disposed and a sixth surface opposite to the fifth surface,
a third semiconductor substrate on the sixth surface of the third insulating layer,
a third transistor on the third semiconductor substrate, and
a third metal layer in the third insulating layer and connected to the third transistor, and
wherein a width of the through via becomes narrower as the width of the through via approaches the third surface.

11. The image sensor of claim 10, further comprising a first through via connecting the first chip and the second chip,
wherein the first through via extends from the first surface to be in direct contact with the second metal layer.

12. The image sensor of claim 11, wherein the first through via is in direct contact with the first metal layer to connect the first metal layer and the second metal layer.

13. The image sensor of claim 11, wherein the first through via is not in direct contact with the first metal layer.

14. The image sensor of claim 10, wherein the pad metal is in direct contact with the through via.

15. An image sensor, comprising:
a sequential stack of a first chip, a second chip, and a third chip; and
a pad metal connecting the second chip and the third chip,
wherein the first chip includes
a first semiconductor substrate including a first surface and a second surface opposite to the first surface,
a photoelectric conversion layer in the first semiconductor substrate,
a color filter on the first surface,
a micro lens covering the color filter,
a first transistor on the second surface of the first semiconductor substrate and adjacent to the photoelectric conversion layer,
a first insulating layer on the second surface,
a first metal layer in the first insulating layer and connected to the first transistor, and
a first bonding pad electrically connected to the first metal layer, the first bonding pad being in the first insulating layer, the first bonding pad having one surface exposed on the first insulating layer,
wherein the second chip includes
a second insulating layer including a third surface in direct contact with the first insulating layer and a fourth surface opposite to the third surface,
a second semiconductor substrate on the fourth surface of the second insulating layer,
a second transistor on the second semiconductor substrate, a second metal layer in the second insulating layer and connected to a gate structure of the second transistor through a gate contact, a second bonding pad connected to the second metal layer, the second bonding pad being in the second insulating layer, the second bonding pad having one surface exposed on the third surface of the second insulating layer, a landing metal layer below the second metal layer with respect to the second semiconductor substrate, and a through via in direct contact with the landing metal layer and vertically passing through the second semiconductor substrate, wherein the third chip includes a third insulating layer including a fifth surface on which a pad in direct contact with the through via is disposed and a sixth surface opposite to the fifth surface;

a third semiconductor substrate on the sixth surface of the third insulating layer, a third transistor disposed on the third semiconductor substrate, and a third metal layer in the third insulating layer and connected to the third transistor, wherein a width of the through via becomes narrower as the width of the through via approaches the third surface, and wherein the first bonding pad is in direct contact with the second bonding pad.

16. The image sensor of claim 15, wherein each of the first and second bonding pads includes a conductive material.

17. The image sensor of claim 15, wherein a portion of the first bonding pad is in direct contact with the second insulating layer of the second chip, and the first insulating layer includes one or more inner surfaces at least partially defining a cavity surrounded by the first bonding pad and the first and second insulating layers.

18. The image sensor of claim 15, wherein the first chip includes a first dummy pad in the first insulating layer, the first dummy pad having one surface exposed on the first insulating layer, the second chip includes a second dummy pad in the second insulating layer, the second dummy pad having one surface exposed on the third surface of the second insulating layer, and the first dummy pad is in direct contact with the second dummy pad.

19. The image sensor of claim 15, wherein the second chip further includes a fourth insulating layer between the second semiconductor substrate and the landing metal layer.

20. The image sensor of claim 19, wherein the fourth insulating layer is in direct contact with a lower surface of the landing metal layer, and a height of an upper surface of the fourth insulating layer matches a height of an upper surface of the gate structure with respect to a bottom surface of the second chip.

* * * * *